United States Patent
Roberts et al.

(10) Patent No.: US 9,673,766 B1
(45) Date of Patent: Jun. 6, 2017

(54) CLASS F AMPLIFIERS USING RESONANT CIRCUITS IN AN OUTPUT MATCHING NETWORK

(71) Applicant: FREESCALE SEMICONDUCTOR INC., Austin, TX (US)

(72) Inventors: Jeffrey S. Roberts, Scottsdale, AZ (US); Damon G. Holmes, Scottsdale, AZ (US); Ning Zhu, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 15/158,405

(22) Filed: May 18, 2016

(51) Int. Cl.
| | | |
|---|---|---|
| *H03F 3/191* | (2006.01) | |
| *H03F 3/217* | (2006.01) | |
| *H03F 1/56* | (2006.01) | |
| *H03F 3/193* | (2006.01) | |
| *H03F 1/02* | (2006.01) | |

(52) U.S. Cl.
CPC ......... *H03F 3/2171* (2013.01); *H03F 1/0205* (2013.01); *H03F 1/565* (2013.01); *H03F 3/193* (2013.01); *H03F 3/191* (2013.01); *H03F 2200/318* (2013.01); *H03F 2200/391* (2013.01); *H03F 2200/451* (2013.01); *H03F 2200/552* (2013.01)

(58) Field of Classification Search
CPC . H03F 1/42; H03F 1/565; H03F 3/193; H03F 2200/216; H03F 2200/301; H03F 2200/451; H03F 3/195; H03F 2200/222; H03F 2200/38; H01L 23/66

USPC .......................................................... 330/302
See application file for complete search history.

(56) References Cited

U.S. PATENT DOCUMENTS

| | | | |
|---|---|---|---|
| 5,146,178 A | 9/1992 | Nojima et al. | |
| 6,177,841 B1* | 1/2001 | Ohta | H03F 1/0205 330/302 |
| 6,784,732 B2* | 8/2004 | Hajimiri | H02M 7/48 330/207 A |
| 7,741,907 B2 | 6/2010 | Takagi | |
| 8,350,627 B2* | 1/2013 | Hellberg | H03F 1/0205 330/302 |
| 2008/0231373 A1* | 9/2008 | Rahman | H01L 23/66 330/302 |

OTHER PUBLICATIONS

Grebennikov, A., "Circuit Design Technique for High Efficiency Class F Amplifiers," Institute of Microelectronics (IME), WE2C-1, 2000 IEEE MTT-D Digest, pp. 771-774.

(Continued)

*Primary Examiner* — Khanh V Nguyen

(57) ABSTRACT

The embodiments described herein provide class F amplifiers and methods of operation. So implemented, the class F amplifiers can be used to provide high efficiency amplification for a variety of applications, including radio frequency (RF) applications. In general, the class F amplifiers are implemented with at least one transistor and an output matching network, where the output matching network includes a plurality of resonant circuits configured to facilitate class F amplifier operation. In addition to facilitating class F amplifier operation, the plurality of resonant circuits can also be implemented with other circuit elements to provide output impedance transformation in a way that facilitates efficient amplifier operation.

21 Claims, 17 Drawing Sheets

(56) References Cited

OTHER PUBLICATIONS

Trask, C., "Class-F Amplifier Loading Networks: A Unified Design Approach," ATG Design Services, MO4C-1, 1999 IEEE MTT-S Digest, pp. 351-354.
Beltran, R., "Class-F and Inverse Class-F Power Amplifier Loading Networks Design Based Upon Transmission Zeros," Skyworks Solutions Inc., 2014 IEEE, pp. 1-4.
Staudinger, J., U.S. Appl. No. 14/572,396, entitled "Inverse Class F Amplifiers With Intrinsic Capacitance Compensation," filed Dec. 16, 2014.
Zhu, N., U.S. Appl. No. 14/919,511, entitled "RF Power Transistors With Video Bandwidth Circuits, and Methods of Manufacture Thereof," filed Oct. 21, 2015.

\* cited by examiner

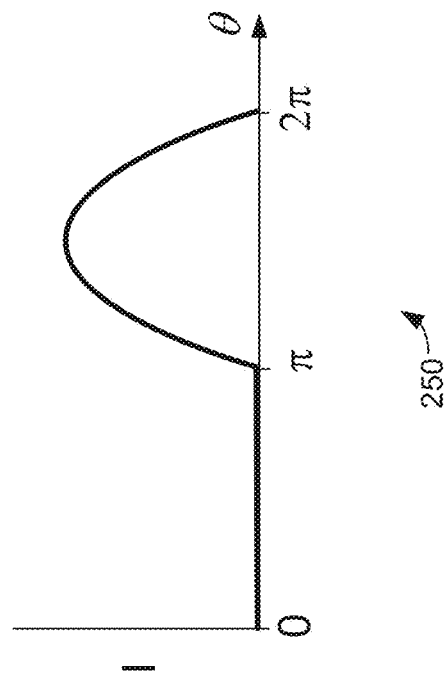
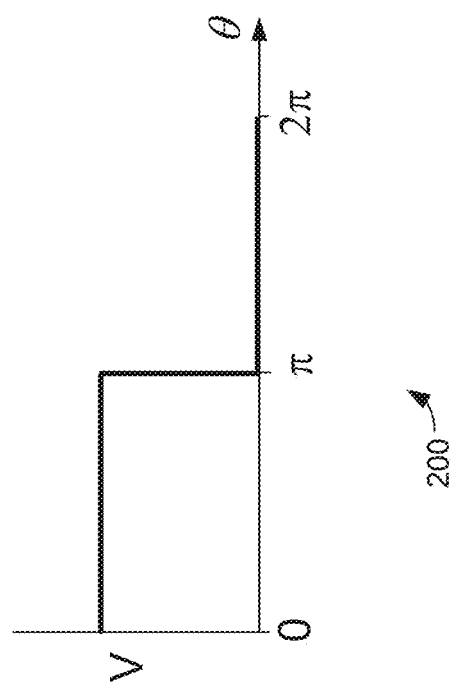
FIG. 2

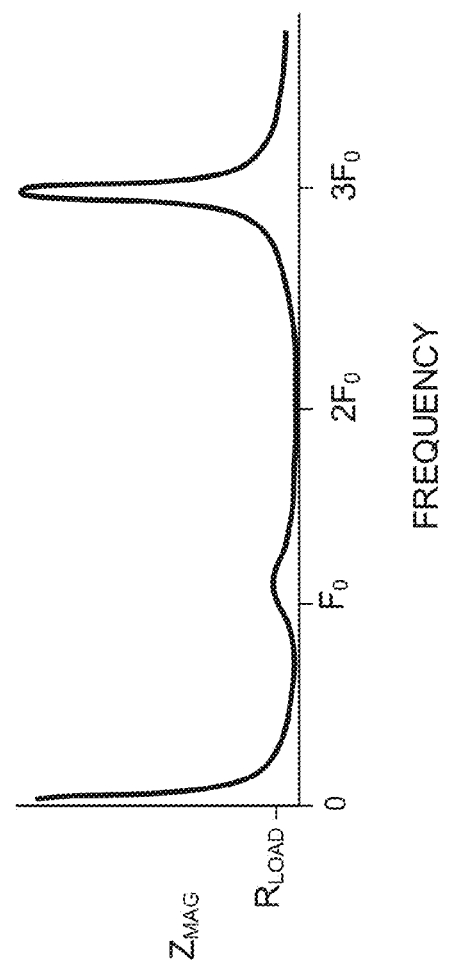
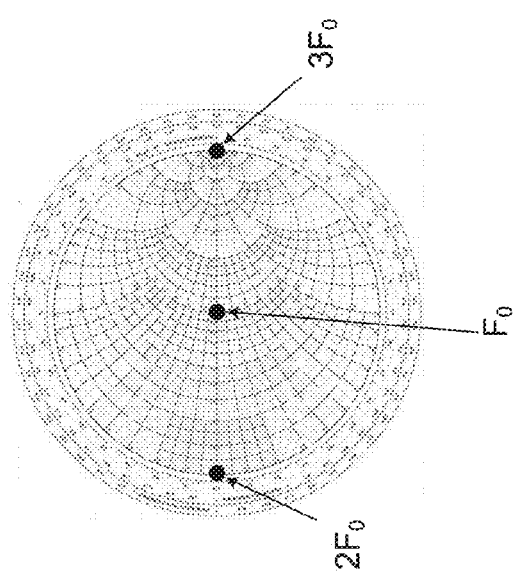
FIG. 12

CLASS F AMPLIFIERS USING RESONANT CIRCUITS IN AN OUTPUT MATCHING NETWORK

TECHNICAL FIELD

The embodiments described herein relate generally to amplifiers and methods of their operation.

BACKGROUND

Amplifiers are used in a wide variety of applications. In general, amplifiers are used to increase the power of signals. For example, amplifiers can be used to convert low-power radio frequency (RF) signals into larger RF signals for driving the antenna of a transmitter. In such cases, amplifiers may be implemented as part of an overall RF transmission system.

Power amplifiers tend to consume a significant portion of the total power consumed by a transmission system. Therefore, the power amplifier's efficiency (i.e., the power of the amplifier output signal divided by the total power consumed by the amplifier) is an amplifier quality that designers consistently strive to increase.

One method used to distinguish the type of amplifier is by "class". The amplifier class represents the amount of time the transistor is conducting current over one cycle when excited by a sinusoidal input signal. In general, classes such as A, B and C are conduction angle amplifiers defined by the length of their conductive state over one cycle when excited by a sinusoidal input signal. In these amplifiers the output stage is being driven to an intermediate level between being fully on and fully off. In contrast, classes such as D and E, are "switching" amplifiers that that are constantly switched between fully on and fully off. Other amplifiers, such as class F (and inverse class F) are conduction angle amplifiers where additional methods are employed to shape the transistor current and voltage waveforms to yield improvements in parameters such as amplifier output power and efficiency.

Specifically, class F and inverse class F amplifiers are amplifiers that can boost efficiency and output power by shaping the output waveform into a near square wave with the use of harmonic resonators. So implemented, class F and inverse class F amplifiers can provide efficiencies of more than 90 percent in some applications. Such high efficiency amplifiers are increasingly desirable in radio frequency (RF) mobile communication applications. For example, high efficiency is increasingly important in mobile phones, tablets, and other devices where long battery life is highly desirable. Unfortunately, implementing high efficiency class F amplifiers can be problematic. For example, the device output capacitance in many devices can prevent the effective and efficient implementation of high efficiency RF amplifiers for high power applications.

BRIEF DESCRIPTION OF THE DRAWINGS

FIG. 2 is a graphical representation of a voltage waveform and current waveform in an exemplary class F amplifier;

FIG. 12 is a Smith Chart and graphical representation of output impedances of a class F amplifier in accordance with another example embodiment;

DETAILED DESCRIPTION

The embodiments described herein provide class F amplifiers and methods of operation. So implemented, the class F amplifiers can be used to provide high efficiency amplification for a variety of applications, including radio frequency (RF) applications. In general, the class F amplifiers are implemented with at least one transistor and an output matching network, where the output matching network includes a plurality of resonant circuits configured to facilitate class F amplifier operation. In addition to facilitating class F amplifier operation, the plurality of resonant circuits can also be implemented with other circuit elements to provide output impedance transformation in a way that facilitates efficient amplifier operation.

Specifically, the devices and methods described herein use an output matching network that includes three sets of resonant circuits. The three sets of resonant circuits include resonant circuits that are configured to resonate at different frequencies, including the fundamental frequency ($f_0$), the second harmonic frequency ($2f_0$), and the third harmonic frequency ($3f_0$). The resonating of the resonant circuits at these three different frequencies facilitates high efficiency class F amplifier operation.

Figure 1:
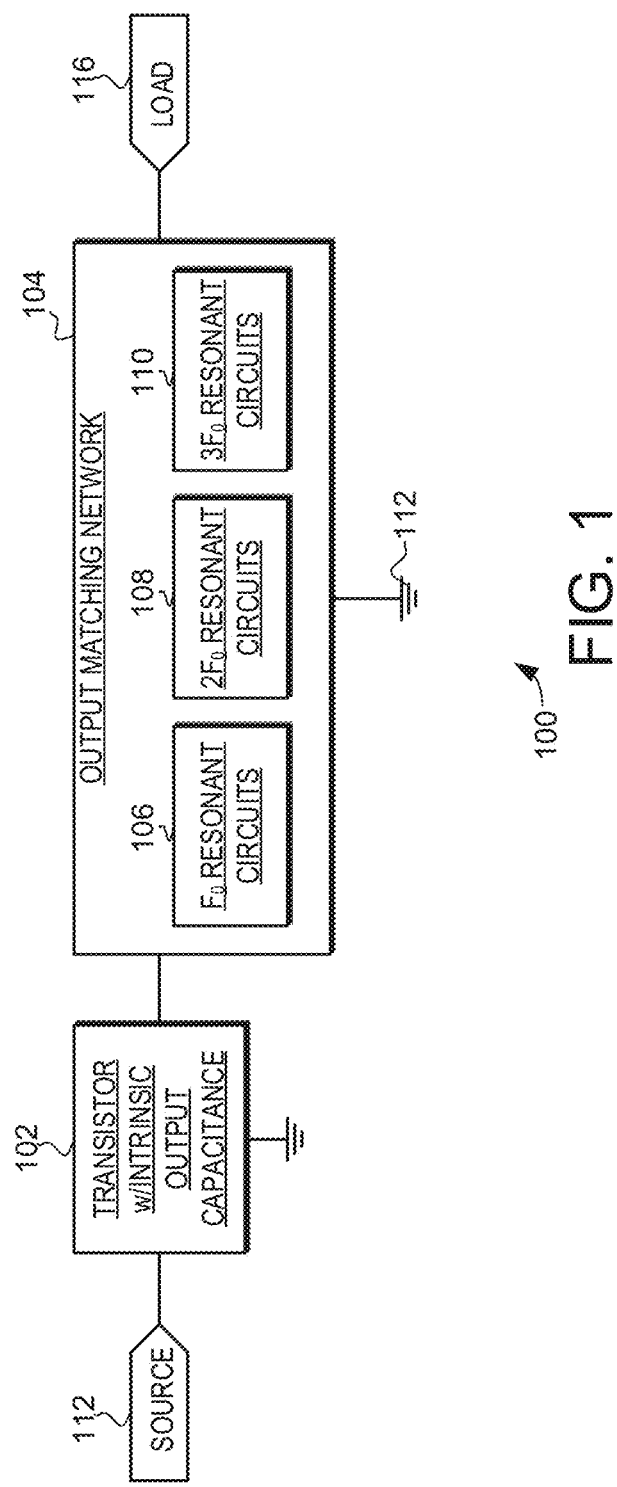
FIG. 1 is a schematic diagram of an class F amplifier in accordance with an example embodiment.

Turning now to FIG. 1, an exemplary class F amplifier 100 is illustrated schematically. In this embodiment the amplifier 100 includes a transistor 102 and an output matching network 104. The transistor 102 may be any suitable transistor type, including a field effect transistor (FET), such as a gallium nitride (GaN) FET or a silicon or gallium arsenide (GaAs) FET. During operation, the amplifier 100 receives an input signal at a source 112, and outputs an amplified signal through the output matching network 104 and to the load 116. The output amplified signal has a fundamental frequency ($f_0$) and multiple harmonic signals, including a second harmonic of twice the fundamental frequency ($2f_0$) and a third harmonic of three times the fundamental frequency ($3f_0$).

In accordance with the embodiments described herein, the output matching network 104 includes three sets of resonant circuits, with a first set of resonant circuits 106 configured to resonate at a fundamental frequency ($f_0$), a second set of resonant circuits 108 configured to resonate at a second harmonic frequency ($2f_0$), and a third set of resonant circuits 110 configured to resonate at a third harmonic frequency ($3f_0$). As will be described below, these three sets of resonant circuits (106, 108 and 110) facilitate the operation of the amplifier 100 as an effective, high efficiency, class F amplifier.

In general, the class F amplifiers operate by generating defined output voltage and current waveforms. These output waveforms minimize power consumption by reducing the portions of each cycle where current and voltage overlap. Turning to FIG. 2, a graph 200 illustrates an idealized output voltage and graph 250 illustrates an idealized output current for an exemplary class F amplifier (e.g., amplifier 100). As can be seen in FIG. 2, the output voltage is a square wave that is non-zero over the first half of the output cycle, and the output current is a half-sinusoid that is non-zero only over the second half of the output signal. When so implemented with substantially non-overlapping voltage and current output waveforms, power consumption is reduced, and a high efficiency class F amplifier is provided.

To generate such voltage and current waveforms and provide class F amplifier operation, the impedance presented at a transistor (e.g., transistor 102), as referenced to the current source in the transistor, should exhibit high impedance to frequencies at the odd harmonics and low impedance to frequencies at even harmonics. In particular, providing low impedance for signals at the second harmonic is of particular importance, with diminishing importance for higher order even harmonic frequencies. Likewise, providing high impedance for signals at the third harmonic is of particular importance, with diminishing importance for higher order odd harmonic frequencies. Thus for many applications, providing a low impedance (e.g., short circuit) for signals at the second harmonic frequency ($2f_0$) and providing a high impedance (e.g., open circuit) for signals at the third harmonic frequency ($3f_0$) can be sufficient to provide effective class F amplifier performance.

As noted above, the intrinsic output capacitance of a typical transistor (e.g., transistor 102) will typically allow a capacitive reactance path to ground for high frequency signals, including third harmonic frequency signals ($3f_0$). Such a capacitive reactance path would, if left uncompensated, provide a low impedance path to third harmonic frequencies, and thus would prevent efficient class F operation. The embodiments described herein overcome this by incorporating the intrinsic output capacitance into the third set of resonant circuits for the third harmonic frequency ($3f_0$) in a way that eliminates the low impedance path that would otherwise exist for signals at the third harmonic frequency ($3f_0$).

Returning to FIG. 1, the amplifier 100 is configured to provide high efficiency, class F operation through the use of the three sets of resonant circuit in the output matching network 104. Specifically, in accordance with the embodiments described herein, the output matching network includes three sets of resonant circuits, with a first set of resonant circuits 106 configured to resonate at a fundamental frequency ($f_0$), a second set of resonant circuits 108 configured to resonate at a second harmonic frequency ($2f_0$), and a third set of resonant circuits 110 configured to resonate at a third harmonic frequency ($3f_0$). In general, the first set of resonant circuits 106 is configured to provide an output impedance to the transistor 102 output for signals at the fundamental frequency ($f_0$). The second set of resonant circuits 106 is configured to create a short circuit between the transistor 102 output and a ground for signals at the second harmonic frequency ($2f_0$). The third set of resonant circuits 110 is configured to create an open circuit between the transistor output and a load for signals at the third harmonic frequency ($3f_0$). Taken together these three sets of resonant circuits 106, 108 and 110 facilitate the operation of the amplifier 100 as an effective, high efficiency, class F amplifier.

As noted above, the first set of resonant circuits 106 is configured to resonate at the fundamental frequency ($f_0$) to present an output impedance to the transistor output for signals at the fundamental frequency ($f_0$). In one embodiment, this first set of resonant circuits 106 includes a first $f_0$ resonant circuit configured to resonate at the fundamental frequency ($f_0$), and wherein when the first $f_0$ resonant circuit resonates, a second $f_0$ resonant circuit is realized in the output matching network, where this second $f_0$ resonant circuit also includes the intrinsic output capacitance of the transistor 102. This second $f_0$ resonant circuit is configured to resonate at the fundamental frequency ($f_0$) and create an open circuit between the transistor output and a ground 112 when resonating.

It should be noted that in this configuration the second $f_0$ resonant circuit is dependent upon the resonating of the first $f_0$ resonant circuit. Specifically, the second $f_0$ resonant circuit is not in a form that will resonate at the fundamental frequency ($f_0$) without the simultaneous resonating of the first $f_0$ resonant circuit. This dependent resonant configuration facilitates the use of the various resonant circuits in a way that will facilitate class F amplifier performance. Detailed examples of such dependent resonant circuits will be discussed in greater detail below.

Furthermore, in various embodiments the first set of resonant circuits 106 can additionally include a third $f_0$ resonant circuit and a fourth $f_0$ resonant circuit, with these resonant circuits likewise configured to resonate at the fundamental frequency ($f_0$). In these embodiments the third $f_0$ resonant circuit and the fourth $f_0$ resonant circuit can be configured to couple the transistor output to a load for signals at the fundamental frequency ($f_0$).

In such an embodiment the fourth $f_0$ resonant circuit can be dependent upon the resonating of the third $f_0$ resonant circuit. Thus, the fourth $f_0$ resonant circuit is also not in a form that will resonate at the fundamental frequency ($f_0$) without the simultaneous resonating of the third $f_0$ resonant circuit. Again, detailed examples of such dependent resonant circuits will be discussed in greater detail below.

In one embodiment, the third set of resonant circuits 110 includes a first $3f_0$ resonant circuit, wherein when the first $3f_0$ resonant circuit resonates, a second $3f_0$ resonant circuit is realized in the output matching network. In this embodiment, the second $3f_0$ resonant circuit also includes the intrinsic output capacitance. This second $3f_0$ resonant circuit is configured to resonate at the third harmonic frequency ($3f_0$) and create an open circuit between the transistor output and the ground for signals at the third harmonic frequency ($3f_0$).

Again, in such an embodiment the second $3f_0$ resonant circuit can be dependent upon the resonating of the first $3f_0$ resonant circuit. Thus, the second $3f_0$ resonant circuit is also not in a form that will resonate at the third harmonic frequency ($3f_0$) without the simultaneous resonating of the first $3f_0$ resonant circuit. Again, detailed examples of such dependent resonant circuits will be discussed in greater detail below.

Furthermore, the third set of resonant circuits 110 can additionally include a third $3f_0$ resonant circuit configured to resonate at the third harmonic frequency ($3f_0$). In this embodiment, the third $3f_0$ resonant circuit is configured to resonate at the third harmonic frequency ($3f_0$) and create an open circuit between the transistor output and the load for signals at the third harmonic frequency ($3f_0$).

Figure 3:
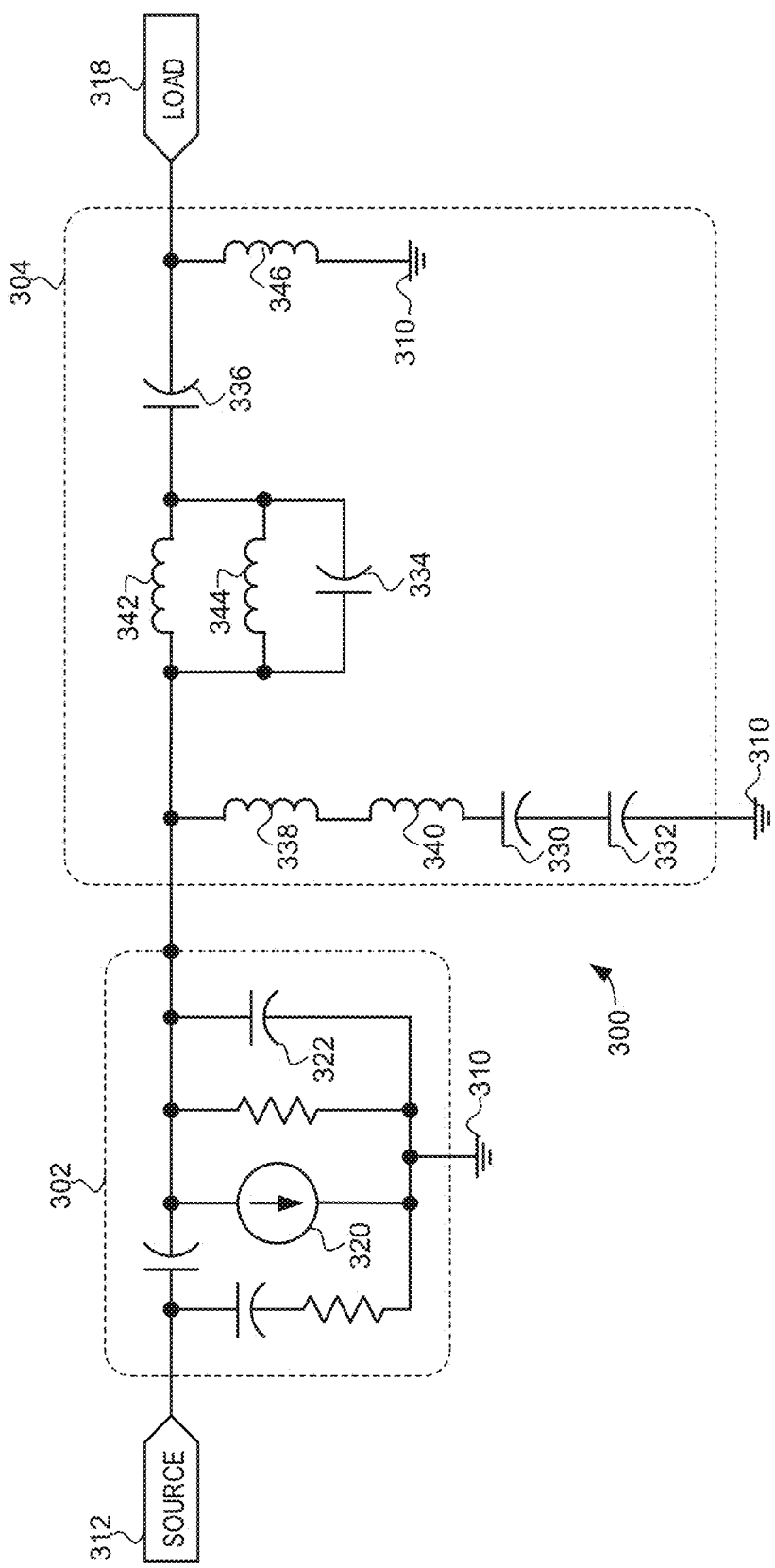
FIGS. 3-6 are schematic diagrams of a class F amplifier in accordance with an example embodiment.

Turning now to FIG. 3, an exemplary class F amplifier 300 is illustrated schematically. In this embodiment the amplifier 300 includes a transistor 302 and an output matching network 304. During operation, the amplifier 300 receives an input signal at a source terminal 312, and outputs an amplified signal through the output matching network 304 and to the load 318. The signal has a fundamental frequency ($f_0$), and as such includes multiple harmonic signals, including a second harmonic ($2f_0$) and third harmonic ($3f_0$).

In FIG. 3, the transistor 302 is modelled as a current source 320 and associated resistances and capacitances. A control terminal (e.g., a gate) of the transistor 302 is coupled to the source terminal 312, a first current conducting terminal (e.g., a drain or source) is coupled to the matching network 304, and a second current conducting terminal (e.g., a source or drain) is coupled to ground (or another voltage reference). Included in the transistor model is an intrinsic output capacitance 322. In a typical field-effect transistor implementation, the intrinsic output capacitance 322 would be a drain-source capacitance commonly referred to as $C_{DS}$. In a typical bipolar transistor, the intrinsic output capacitance 322 would be a collector-emitter capacitance commonly referred to as $C_{CE}$. It should be noted that such an intrinsic output capacitance 322 would normally provide a capacitive reactance path to ground that would prevent efficient class F operation. However, in the embodiments described herein, the intrinsic output capacitance 322 is selectively resonated with resonant circuits in output matching network 304 to block the path to ground 310 for both signals at the fundamental frequency ($f_0$) and for third harmonic signals ($3f_0$), and this facilitates class F amplifier operation.

In the embodiment illustrated in FIG. 3, the output matching network 304 is implemented with capacitances 330, 332, 334 and 336, and with inductances 338, 340, 342, 344 and 346. It should be noted that while FIG. 3 illustrates various capacitances and inductances as separate elements, in some cases theses capacitances and inductances can be implemented together in a physical device. For example, the capacitances 330 and 332 can be implemented as one physical capacitor. Likewise, the inductances 338 and 340 can be implemented as one physical inductor. These various capacitance and inductances in the output matching network 304 are configured to provide three sets of resonant circuits in the amplifier 300. In general, the first set of resonant circuits, in conjunction with the intrinsic output capacitance 322, is configured to present selected output impedance to the transistor 302 output for signals at the fundamental frequency ($f_0$). The second set of resonant circuits is configured to create a short circuit between the transistor 302 output and ground 310 for signals at the second harmonic frequency ($2f_0$). With intrinsic output capacitance 322, the third set of resonant circuits is configured to create an open circuit between the transistor 302 output and the load 318, and between the transistor 302 and the ground 310 for signals at the third harmonic frequency ($3f_0$). Taken together the output matching network 304 facilitates the operation of the amplifier 300 as an effective, high efficiency, class F amplifier.

Figure 4:
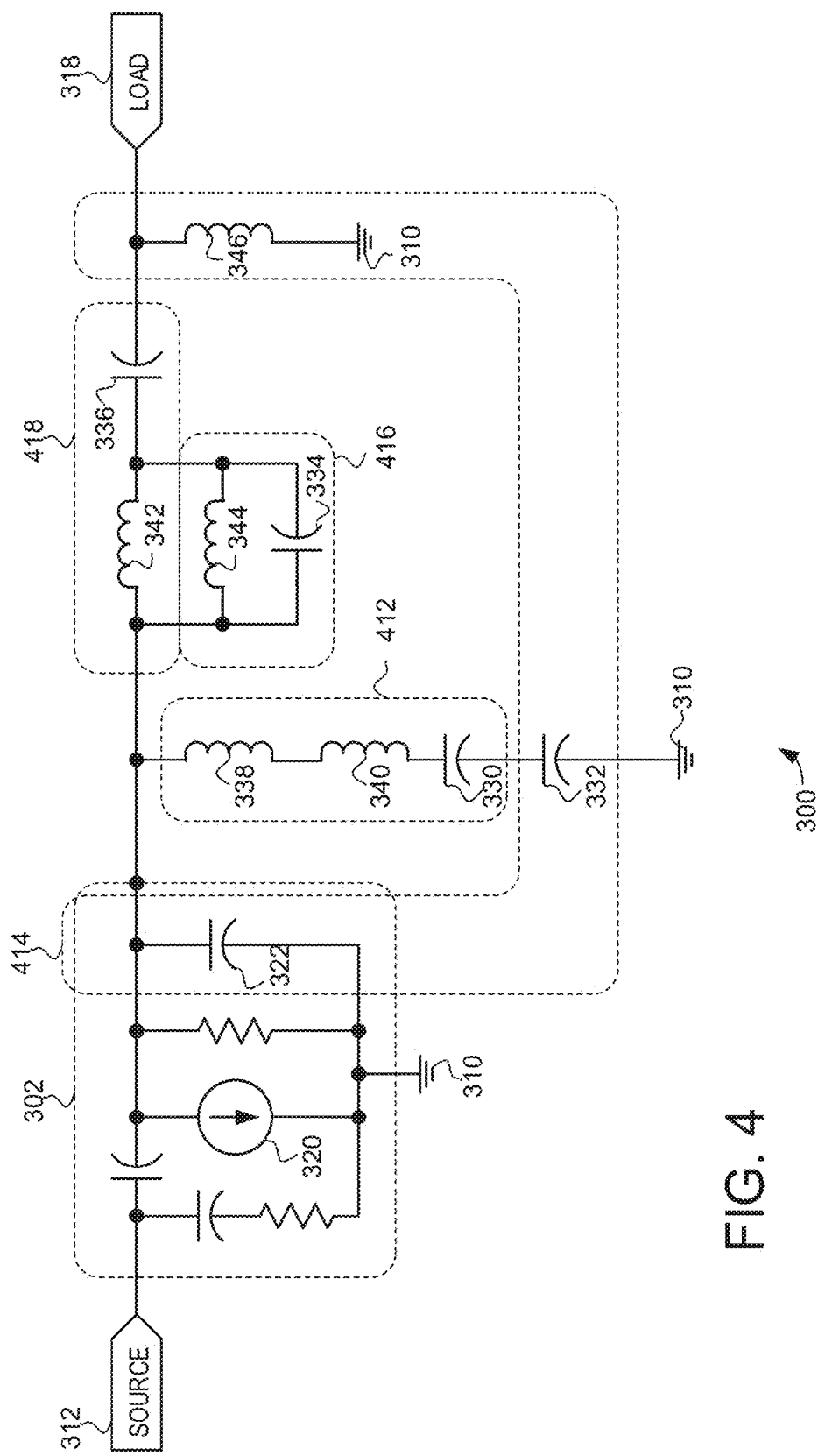

Turning now to FIG. 4, the exemplary class F amplifier 300 is again illustrated schematically. However, in this illustration each of the first set of resonant circuits are individually identified and labelled. In general, the first set of resonant circuits is configured to present selected output impedance to the transistor 302 output for signals at the fundamental frequency ($f_0$). Specifically, the first set of resonant circuits includes a first $f_0$ resonant circuit 412, a second $f_0$ resonant circuit 414, a third $f_0$ resonant circuit 416, and a fourth $f_0$ resonant circuit 418. The first $f_0$ resonant circuit 412 includes capacitance 330 and inductances 338 and 340 coupled in series between the transistor 302 output and capacitance 332. The second $f_0$ resonant circuit 414 includes intrinsic output capacitance 322, capacitance 332, and inductance 346 coupled in parallel between ground 310 and either the output of transistor 302 or the output of the class F amplifier 300. The third $f_0$ resonant circuit 416 includes capacitance 334 and inductance 344 coupled in parallel across inductance 342. The fourth $f_0$ resonant circuit 418 includes capacitance 336 and inductance 342 coupled in series between the output of transistor 302 and the output of the class F amplifier 300. Each of these resonant circuits 412, 414, 416 and 418 are configured to resonate at the fundamental frequency ($f_0$). As will be described in greater detail below, the resonant circuits 412, 414, 416 and 418 can be configured to resonate at the fundamental frequency ($f_0$) by selecting appropriate values for various capacitances and inductances in the output matching network 304.

Furthermore, it should be noted that in this embodiment the second $f_0$ resonant circuit 414 is dependent upon the resonating of at least the first $f_0$ resonant circuit 412 to be realized. Specifically, in this illustrated embodiment the second $f_0$ resonant circuit 414 is dependent upon the resonating of the first $f_0$ resonant circuit 412, the third $f_0$ resonant circuit 416, and the fourth $f_0$ resonant circuit 418 to be realized. Finally, the fourth $f_0$ resonant circuit 418 is dependent upon the resonating of the third $f_0$ resonant circuit 416.

More specifically, the first $f_0$ resonant circuit 412 is a series LC circuit (i.e., one or more inductors and capacitors in series) configured to resonate at $f_0$. Series LC circuits provide low impedance (e.g., short circuit) when resonating. Thus, for signals at $f_0$, the first $f_0$ resonant circuit 412 resonates and provides a low impedance connection between the transistor 302 output and the capacitance 332.

Likewise, the third $f_0$ resonant circuit 416 is a parallel LC circuit (i.e., an inductor and capacitor in parallel) configured to resonate at $f_0$. Thus, for signals at $f_0$, the third $f_0$ resonant circuit 416 provides high impedance (e.g., open circuit). With the third $f_0$ resonant circuit 416 resonating and providing a high impedance, the fourth $f_0$ resonant circuit 418 is realized as a series LC circuit configured to resonate at $f_0$. Specifically, with the third $f_0$ resonant circuit 416 resonating and providing a high impedance, the capacitance 336 and inductance 342 are then in series and form a series LC circuit configured to resonate at $f_0$. Thus, at $f_0$, the fourth $f_0$ resonant circuit 418 provides low impedance (e.g., short circuit) path.

With each of the first $f_0$ resonant circuit 412, the third $f_0$ resonant circuit 416, and the fourth $f_0$ resonant circuit 418 resonating, and together providing such low impedance or high impedance connections, the second $f_0$ resonant circuit 414 is realized as a parallel LC circuit configured to resonate at $f_0$. Specifically, with the first $f_0$ resonant circuit 412, the third $f_0$ resonant circuit 416, and the fourth $f_0$ resonant circuit 418 resonating providing low or high impedances, the intrinsic output capacitance 322, the capacitance 332, and the inductance 346 are in a parallel configuration and thus form a parallel LC circuit. Parallel LC circuits provide high impedance (e.g., open circuit) when resonating. Thus, for signals at $f_0$, the second $f_0$ resonant circuit 414 provides high impedance (e.g., open circuit) between the transistor 302 output and ground 310.

Taken together, at $f_0$, the four $f_0$ resonant circuits 412, 414, 416 and 418 provide low impedance (e.g., short circuit) path between the transistor 302 output and the load 318. This allows the transistor 302 output to efficiently drive signals at the fundamental frequency ($f_0$) to the load 318.

It should also be noted that in addition to facilitating class F operation, the resonating of the second $f_0$ resonant circuit 414 also effectively reduces the potentially negative effects of the intrinsic output capacitance 322. Specifically, the resonating of the second $f_0$ resonant circuit 414 provides a high impedance to ground 310, which blocks the current path through the intrinsic output capacitance 322 for signals at $f_0$. Without such blocking, the intrinsic output capacitance 322 would provide a path to the ground 310 that can interfere with efficient amplifier operation.

Thus, for signals at the fundamental frequency ($f_0$), the first set of resonant circuits 412, 414, 416, and 418 together compensate for the intrinsic output capacitance 322, provide the transistor 302 with load 318 as the output impedance, and block the signal paths to the ground 310. These actions facilitate efficient class F amplifier operation.

Figure 5:
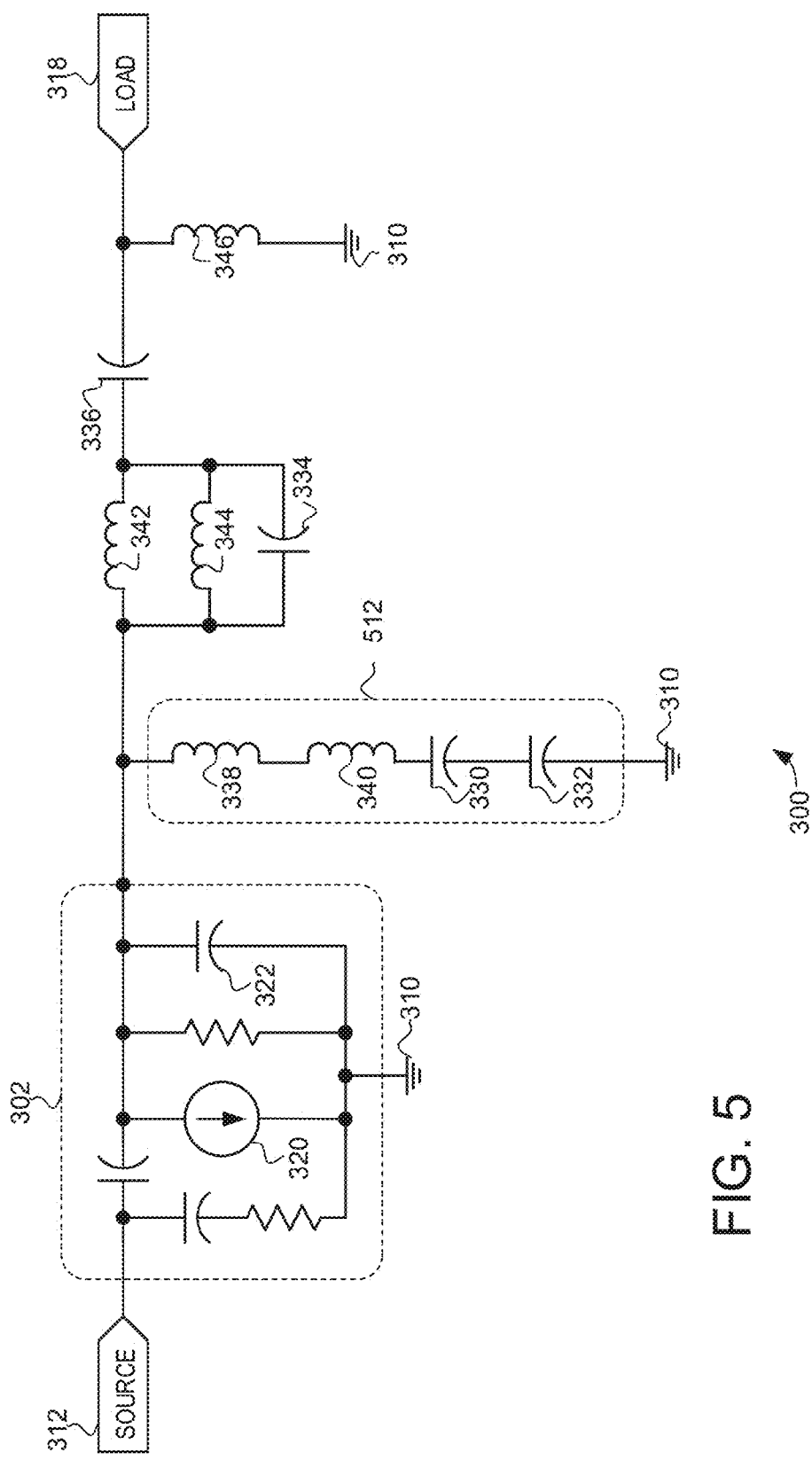

Turning now to FIG. 5, the exemplary class F amplifier 300 is again illustrated schematically. However, in this illustration each of the second set of resonant circuits are individually identified and labelled. In general, the second set of resonant circuits is configured to create a short circuit between the transistor 302 output and ground 310 for signals at the second harmonic frequency ($2f_0$). Specifically, the second set of resonant circuits includes a first $2f_0$ resonant circuit 512. The first $2f_0$ resonant circuit 512 includes capacitances 330 and 332 and inductances 338 and 340 coupled in series between the transistor 302 output and ground 310. The first $2f_0$ resonant circuit 512 is configured to resonate at the second harmonic frequency ($2f_0$). As will be described in greater detail below, the first $2f_0$ resonant circuit 512 can be configured to resonate at the second harmonic frequency ($2f_0$) by selecting appropriate values for various capacitances and inductances in the output matching network 304.

The first $2f_0$ resonant circuit 512 is a series LC circuit configured to resonate at $2f_0$. Again, series LC circuits provide low impedance (e.g., short circuit) when resonating. Thus, for signals at $2f_0$, the first $2f_0$ resonant circuit 512 resonates and provides low impedance connection between the transistor 302 output the ground 310. As described above, providing a short circuit for signals at the second harmonic frequency facilitates class F amplifier operation.

Figure 6:
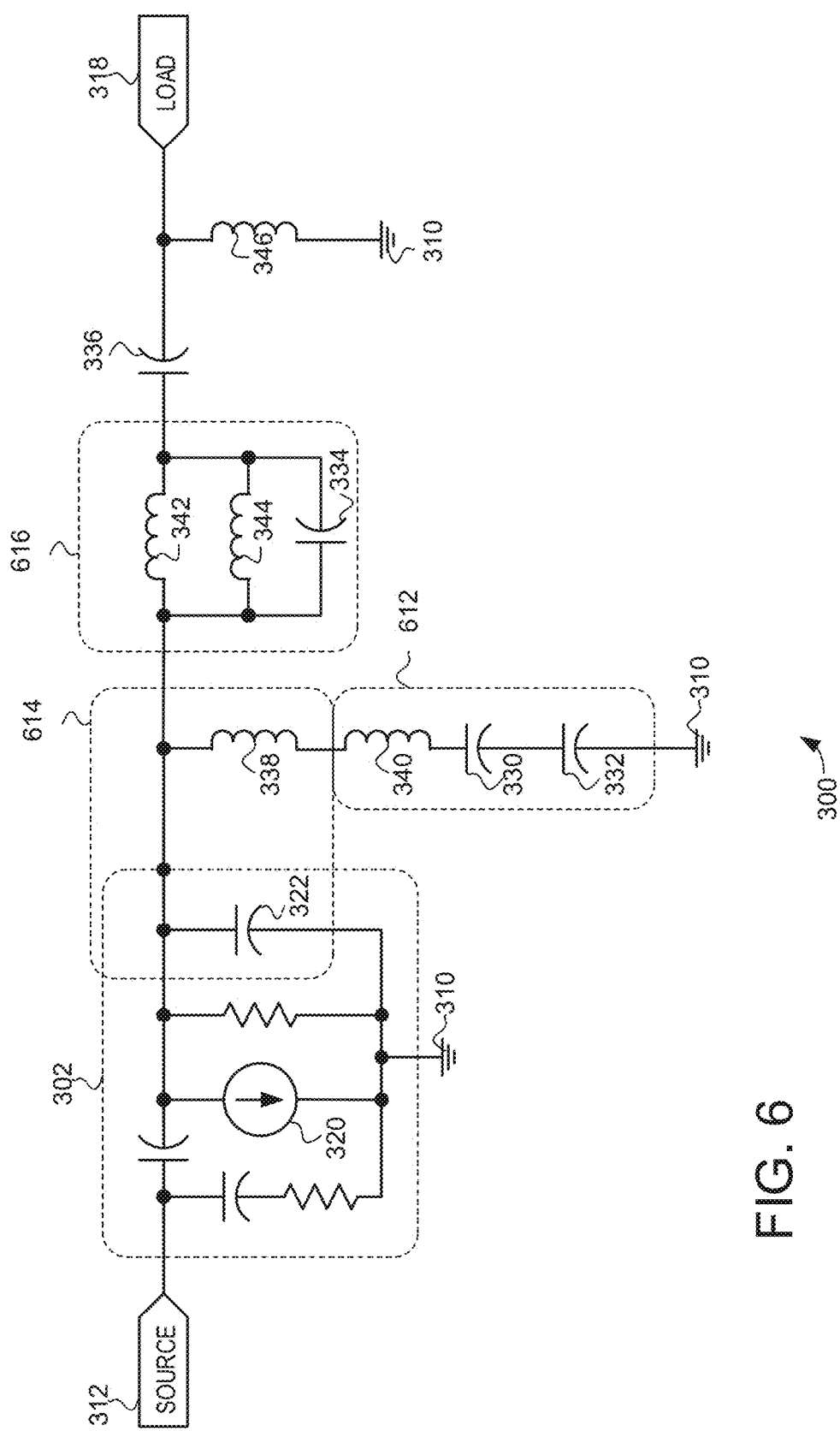

Turning now to FIG. 6, the exemplary class F amplifier 300 is again illustrated schematically. However, in this illustration each of the third set of resonant circuits are individually identified and labelled. In general, the third set of resonant circuits is configured to create an open circuit between the transistor 302 output and ground 310 in addition to the transistor 302 and the load 318 for signals at the third harmonic frequency ($3f_0$). Specifically, the third set of resonant circuits includes a first $3f_0$ resonant circuit 612, a second $3f_0$ resonant circuit 614, and a third $3f_0$ resonant circuit 616. The first $3f_0$ resonant circuit 612 includes capacitances 330 and 332 and inductance 340 coupled in series between inductance 338 and ground 310. The second $3f_0$ resonant circuit 614 includes intrinsic output capacitance 322 and inductance 338 coupled in parallel. The third $3f_0$ resonant circuit 616 includes capacitance 334 and inductances 342 and 344 coupled in parallel between the transistor 302 output and capacitance 336. Each of these resonant circuits 612, 614, and 616 are configured to resonate at the third harmonic frequency ($3f_0$). As will be described in greater detail below, the resonant circuits 612, 614, and 616 can be configured to resonate at the third harmonic frequency ($3f_0$) by selecting appropriate values for various capacitances and inductances in the output matching network 304. Furthermore, it should be noted that in this embodiment the second $3f_0$ resonant circuit 614 is dependent upon the resonating of the first $3f_0$ resonant circuit 612 to be realized.

Specifically, the first $3f_0$ resonant circuit 612 is a series LC circuit configured to resonate at $3f_0$. Series LC circuits provide low impedance (e.g., short circuit) when resonating. Thus, for signals at $3f_0$, the first $3f_0$ resonant circuit 612 resonates and provides low impedance connection between the inductance 338 and the ground 310.

With the first $3f_0$ resonant circuit 612 resonating and providing such a low impedance connection, the second $3f_0$ resonant circuit 614 is realized as a parallel LC circuit configured to resonate at $3f_0$. Specifically, with the first $3f_0$ resonant circuit 612 resonating and providing a low impedance path to ground, the intrinsic output capacitance 322 and the inductance 338 are in a parallel configuration and thus form a parallel LC circuit. Parallel LC circuits provide high impedance (e.g., open circuit) when resonating configured to resonate at $3f_0$. Thus, for signals at $3f_0$, the second $3f_0$ resonant circuit 614 provides high impedance (e.g., open circuit) between the transistor 302 output and ground 310.

It should also be noted that in addition to facilitating class F operation, the resonating of the second $3f_0$ resonant circuit 614 also effectively reduces the potentially negative effects of the intrinsic output capacitance 322. Specifically, the resonating of the second $3f_0$ resonant circuit 614 provides a high impedance that blocks the current path through the intrinsic output capacitance 322 for signals at $3f_0$. Without such blocking, the intrinsic output capacitance 322 would provide a path to the ground 310 that can interfere with efficient class F amplifier operation.

Likewise, the third $3f_0$ resonant circuit 616 is a parallel LC circuit configured to resonate at $3f_0$. Thus, for signals at $3f_0$, the third $3f_0$ resonant circuit 616 provides high impedance (e.g., open circuit), thus blocking the current path to the load 318. Again, providing a high impedance to the transistor 302 output for signals at the third harmonic frequency $3f_0$ facilitates efficient class F amplifier operation.

Thus, the amplifier 300 illustrated in FIGS. 3-6 can facilitate class F operation. Specifically, with the first set of resonant circuits (412, 414, 416, and 418) configured to present a selected output impedance to the transistor 302 output for signals at the fundamental frequency ($f_0$), the second set of resonant circuits (512) configured to create a short circuit between the transistor 302 output and ground 310 for signals at the second harmonic frequency ($2f_0$), and the third set of resonant circuits (612, 614, and 616) configured to create an open circuit between the transistor 302 output and the load 318 for signals at the third harmonic frequency ($3f_0$), and between transistor 302 to the ground 310, amplifier 300 can facilitate class F amplifier performance.

As mentioned above, to facilitate the operation of the amplifier 300 the capacitances and inductances used to implement the output matching network 304 are selected to provide the desired operation of the various resonant circuits at their corresponding resonant frequencies. Thus, in the embodiment illustrated in FIGS. 3-6 the values of the capacitances 330, 332, 334 and 336 and inductances 338, 340, 342, 344 and 346 are selected to provide the resonant circuits 412, 414, 416, 418, 512, 612, 614 and 616. It should be noted that typically the value for the intrinsic output capacitance 322 would be determined by the selection of the transistor 302. As also indicated in FIGS. 3-6 the $f_0$ resonant circuits, the $2f_0$ resonant circuits, and the $3f_0$ resonant circuits "share" components in that some of the same components of the output matching network 304 are used in each of the $f_0$, $2f_0$, and $3f_0$ resonant circuits.

In one embodiment, the capacitances and inductances would have exact values or substantially equal values (e.g., values within +/−10 percent) of values that are selected based on the following relationships:

$$L_1 = \frac{1}{5C_{int}(2\pi f_0)^2}$$

$$L_2 = \frac{1}{9C_2(2\pi f_0)^2}$$

$$L_3 = \frac{3}{8C_{int}(2\pi f_0)^2}$$

$$C_1 = \frac{5}{4}C_{int}$$

where $L_1$ equals the sum of the inductance values of inductances 338 and 340, $L_2$ equals the sum of the inductance values of the inductances 342 and 344, $L_3$ equals the inductance value of the inductance 346, $C_1$ equals the series equivalent capacitance values of capacitances 330 and 332, $C_2$ equals the capacitance value of capacitance 334, $C_3$ equals the capacitance value of capacitance 336, and $C_{int}$ equals the capacitance value of the intrinsic output capacitance 322. By selecting values for the various capacitances and inductances using the relationships above, embodiments of the output matching network 304 may provide the resonant circuits with resonant frequencies that may result in relatively efficient class F amplifier operation.

It should be noted that the various capacitances and inductances can be provided by a variety of structures and devices. For examples, the capacitances can be provided by combinations of discrete capacitors, integrated passive devices, and intrinsic capacitances of elements associated with the amplifier 300 (e.g., the capacitances of bonding pads). Likewise, the inductances can be provided by combinations of discrete inductors, integrated passive devices, and intrinsic inductances of elements associated with the amplifier 300 (e.g., the inductances of bonding wires).

Furthermore, it should again be noted that various capacitances and inductances can be implemented as single devices or as multiple devices. For example, in a typical embodiment the capacitances 330 and 332 can be implemented as one (or more) physical capacitors, e.g., one or more capacitors formed as portions of an integrated passive device. Likewise, in a typical embodiment the inductances 338 and 340 can be implemented as one (or more) physical inductors, e.g., one or more inductors formed as portions of an integrated passive device or as bonding wire arrays. Likewise, the inductances 342 and 344 can be implemented as one (or more) physical inductors, e.g., one or more inductors formed as bonding wire arrays or portions(s) of an integrated passive device. In each case the number of devices used to provide the capacitances and inductances may vary according to the needs of a particular implementation.

Figure 7:
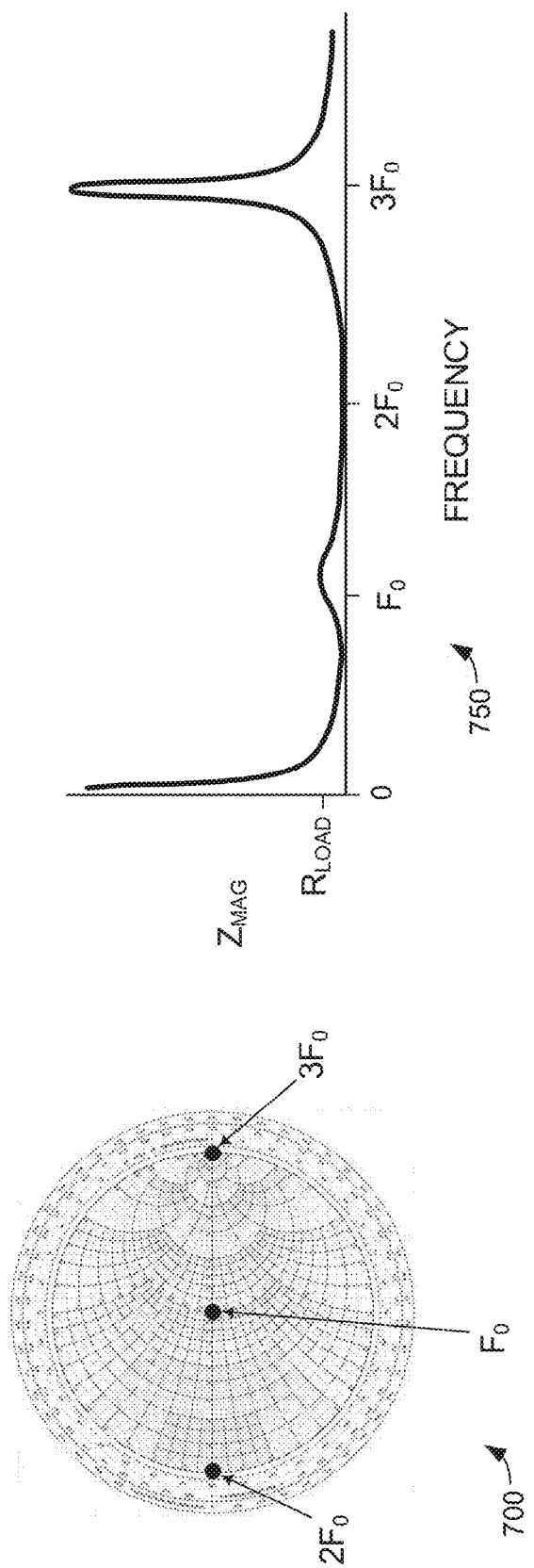
FIG. 7 is a Smith Chart and graphical representation of output impedances of a class F amplifier in accordance with an example embodiment.

Turning now to FIG. 7, a Smith chart 700 and graph 750 illustrate output impedances associated with an exemplary class F amplifier in accordance with the embodiments described herein (e.g., amplifier 300). Specifically, the Smith chart 700 shows the impedance at the transistor 302 output for signals at the fundamental frequency ($f_0$), for signals at the second harmonic frequency ($2f_0$), and for signals at the third harmonic frequency ($3f_0$). As can be seen in the Smith chart 700, for signals at $f_0$ the impedance seen at the transistor output is nearly equal to the load impedance, for signals at $2f_0$ the impedance seen at the transistor output is a near short circuit, and for signals at $3f_0$ the impedance seen at the transistor output is a near open circuit. Similar data is shown in graph 750, which illustrates the magnitude of impedance as function of frequency in graphical form. As can be seen in the graph 750, for signals at $f_0$ the impedance is nearly equal to $R_{LOAD}$, for signals at $2f_0$ the impedance is nearly zero, and for signals at $3f_0$ the impedance seen at the transistor output is very high (e.g., an open circuit).

Figure 8:
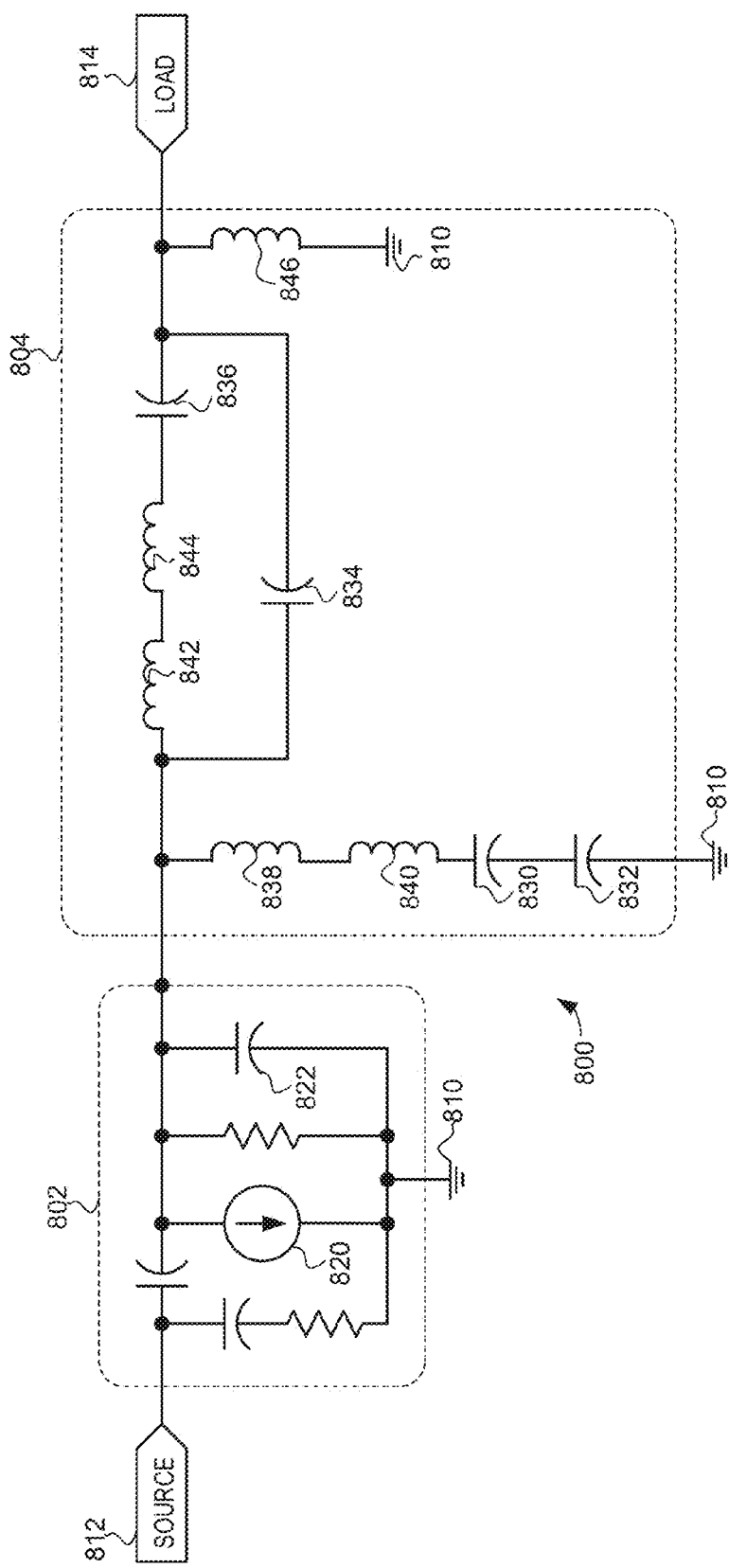
FIGS. 8-11 are schematic diagrams of a class F amplifier in accordance with another example embodiment.

Turning now to FIG. 8, a second embodiment of an exemplary class F amplifier 800 is illustrated schematically. In this embodiment the amplifier 800 includes a transistor 802 and an output matching network 804. During operation, the amplifier 800 receives an input signal at a source terminal 812, and outputs an amplified signal through the output matching network 804 and to the load 814. The signal has a fundamental frequency ($f_0$), and as such includes multiple harmonic signals, including a second harmonic ($2f_0$) and third harmonic ($3f_0$).

In FIG. 8, the transistor 802 is modelled as a current source 820 and associated resistances and capacitances. Included in the transistor model is an intrinsic output capacitance 822.

In the embodiment illustrated in FIG. 8, the output matching network 804 is implemented with capacitances 830, 832, 834 and 836, and with inductances 838, 840, 842, 844 and 846. It should be noted that while FIG. 8 again illustrates various capacitances and inductances as separate elements, in some cases theses capacitances and inductances can be implemented together in a physical device or implemented in separate physical devices.

These various capacitance and inductances in the output matching network 804 are again configured to provide three sets of resonant circuits in the amplifier 800. Again, to facilitate class F amplifier operation, the first set of resonant circuits is configured to present a selected output impedance to the transistor 802 output for signals at the fundamental frequency ($f_0$). The second set of resonant circuits is configured to create a short circuit between the transistor 802 output and ground 810 for signals at the second harmonic frequency ($2f_0$). The third set of resonant circuits is configured to create an open circuit between the transistor 802 output and the load 814, and between the transistor 802 output and the ground 810, for signals at the third harmonic frequency ($3f_0$). Taken together the output matching network 804 facilitates the operation of the amplifier 800 as an effective, high efficiency, class F amplifier.

Figure 9:
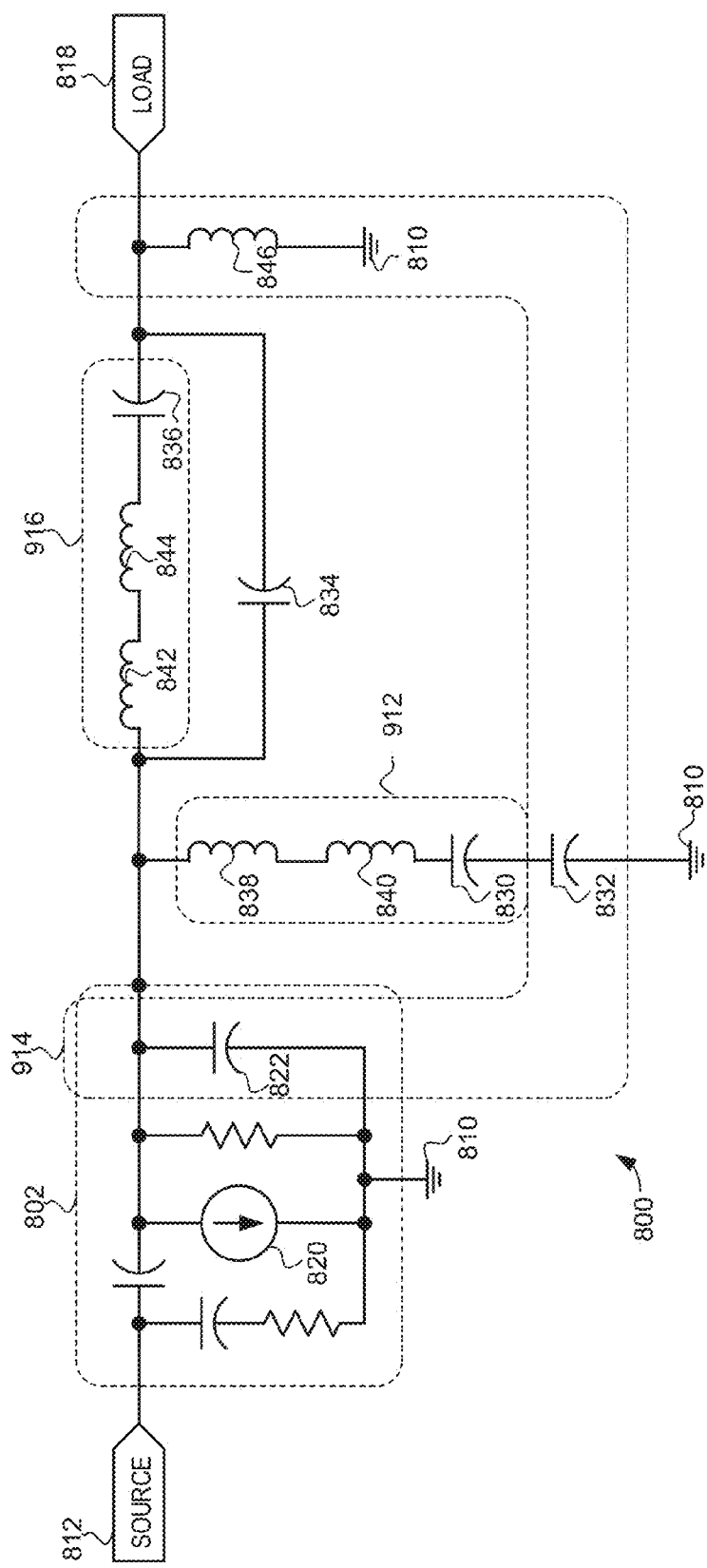

Turning now to FIG. 9, the exemplary class F amplifier 800 is again illustrated schematically. However, in this illustration each of the first set of resonant circuits are individually identified and labelled. In general, the first set of resonant circuits is configured to present selected output impedance to the transistor 802 output for signals at the fundamental frequency ($f_0$). Specifically, the first set of resonant circuits includes a first $f_0$ resonant circuit 912, a second $f_0$ resonant circuit 914, and a third $f_0$ resonant circuit 916. The first $f_0$ resonant circuit 912 includes capacitance 830 and inductances 838 and 840 coupled in series between the transistor 802 output and capacitance 832. The second $f_0$ resonant circuit 914 includes intrinsic output capacitance 822, capacitance 832, and inductance 846 coupled in parallel. The third $f_0$ resonant circuit 916 includes capacitance 836 and inductances 842 and 844 coupled in series between the transistor 802 output and the output of the amplifier 800.

Each of these resonant circuits 912, 914, and 916 are configured to resonate at the fundamental frequency ($f_0$). Again, the resonant circuits 912, 914, and 916 can be configured to resonate at the fundamental frequency ($f_0$) by selecting appropriate values for various capacitances and inductances in the output matching network 804.

Furthermore, it should be noted that in this embodiment the second $f_0$ resonant circuit 914 is dependent upon the resonating of at least the first $f_0$ resonant circuit 912 to be realized. Specifically, in this illustrated embodiment the second $f_0$ resonant circuit 914 is dependent upon the resonating of the first $f_0$ resonant circuit 912 and the third $f_0$ resonant circuit 916 to be realized.

More specifically, the first $f_0$ resonant circuit 912 is a series LC circuit configured to resonate at $f_0$. Thus, for signals at $f_0$, the first $f_0$ resonant circuit 912 resonates and provides low impedance connection between the transistor 802 output and the capacitance 832. Likewise, the third $f_0$ resonant circuit 916 is a series LC circuit configured to resonate at $f_0$. Thus, for signals at $f_0$, the third $f_0$ resonant circuit 912 resonates and provides low impedance connection between the transistor 802 output and the load 818.

With each of the first $f_0$ resonant circuit 912 and third $f_0$ resonant circuit 916 resonating and providing such low impedance connections, the second $f_0$ resonant circuit 914 is realized as a parallel LC circuit configured to resonate at $f_0$. Specifically, with the first $f_0$ resonant circuit 912 resonating and providing a low impedance path to ground, the intrinsic output capacitance 822, the capacitance 832, and the inductance 846 are in a parallel configuration and thus form a parallel LC circuit configured to resonate at $f_0$. Thus, for signals at $f_0$, the second $f_0$ resonant circuit 914 provides high impedance (e.g., open circuit) between the transistor 802 output and ground 810. It should also be noted that in addition to facilitating class F operation, the resonating of the second $f_0$ resonant circuit 914 also effectively reduces the potentially negative effects of the intrinsic output capacitance 822.

Thus, for signals at the fundamental frequency ($f_0$), the first set of resonant circuits 912, 914, and 916, together compensate for the intrinsic output capacitance 822, provide that the transistor 802 sees the load 818 as the output impedance, and blocks the signal paths to the ground 810. These actions again facilitate efficient class F amplifier operation.

Figure 10:
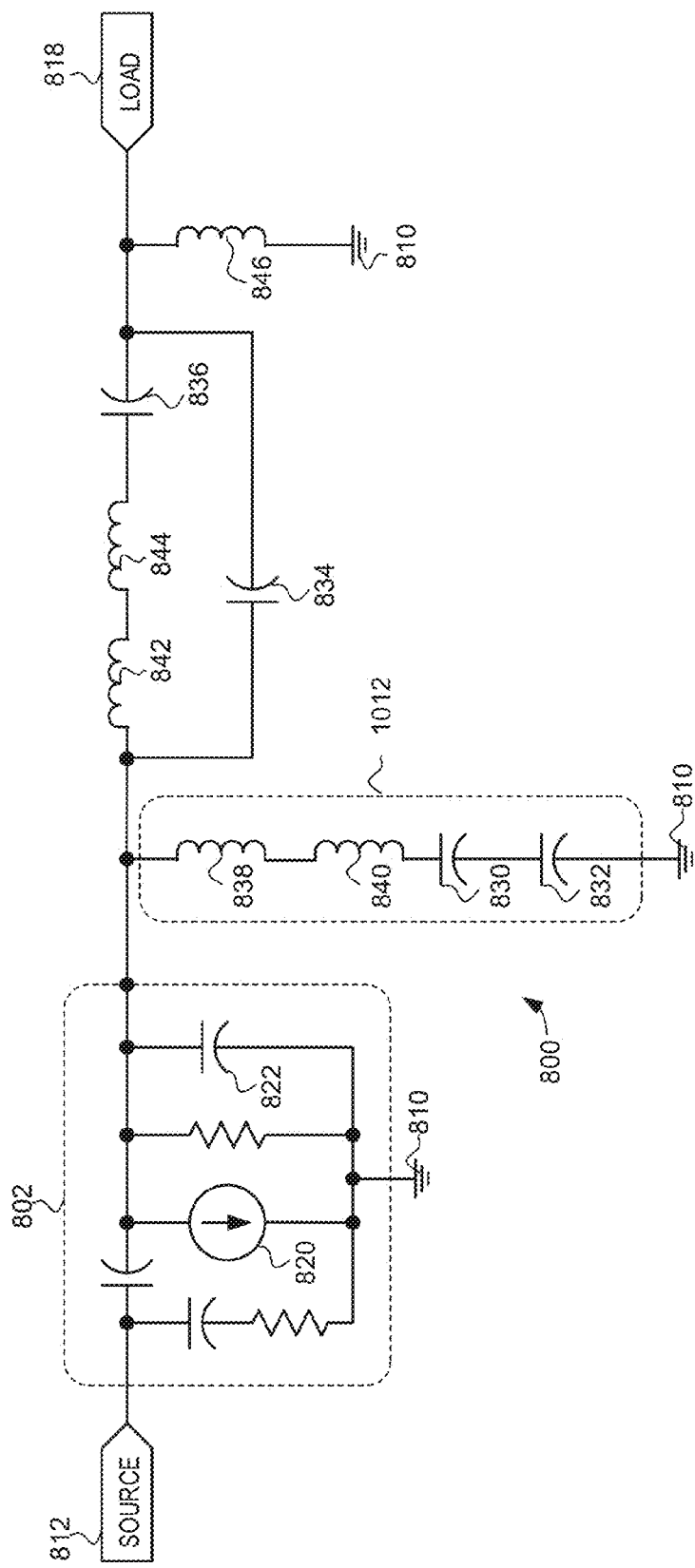

Turning now to FIG. 10, the exemplary class F amplifier 800 is again illustrated schematically. However, in this illustration each of the second set of resonant circuits are individually identified and labelled. In general, the second set of resonant circuits is configured to create a short circuit between the transistor 802 output and ground 810 for signals at the second harmonic frequency ($2f_0$). Specifically, the second set of resonant circuits includes a first $2f_0$ resonant circuit 1012. The first $2f_0$ resonant circuit 1012 includes capacitances 830 and 832 and inductances 838 and 840 coupled in series between the transistor 802 output and ground 810. The first $2f_0$ resonant circuit 1012 is configured to resonate at the second harmonic frequency ($2f_0$). Again, the first $2f_0$ resonant circuit 1012 can be configured to resonate at the second harmonic frequency ($2f_0$) by selecting appropriate values for various capacitances and inductances in the output matching network 804.

The first $2f_0$ resonant circuit 1012 is a series LC circuit configured to resonate at $2f_0$. Thus, for signals at $2f_0$, the first $2f_0$ resonant circuit 1012 resonates and provides low impedance connection between the transistor 802 output and ground 810. As described above, providing a short circuit for signals at the second harmonic frequency facilitates class F amplifier operation.

Figure 11:
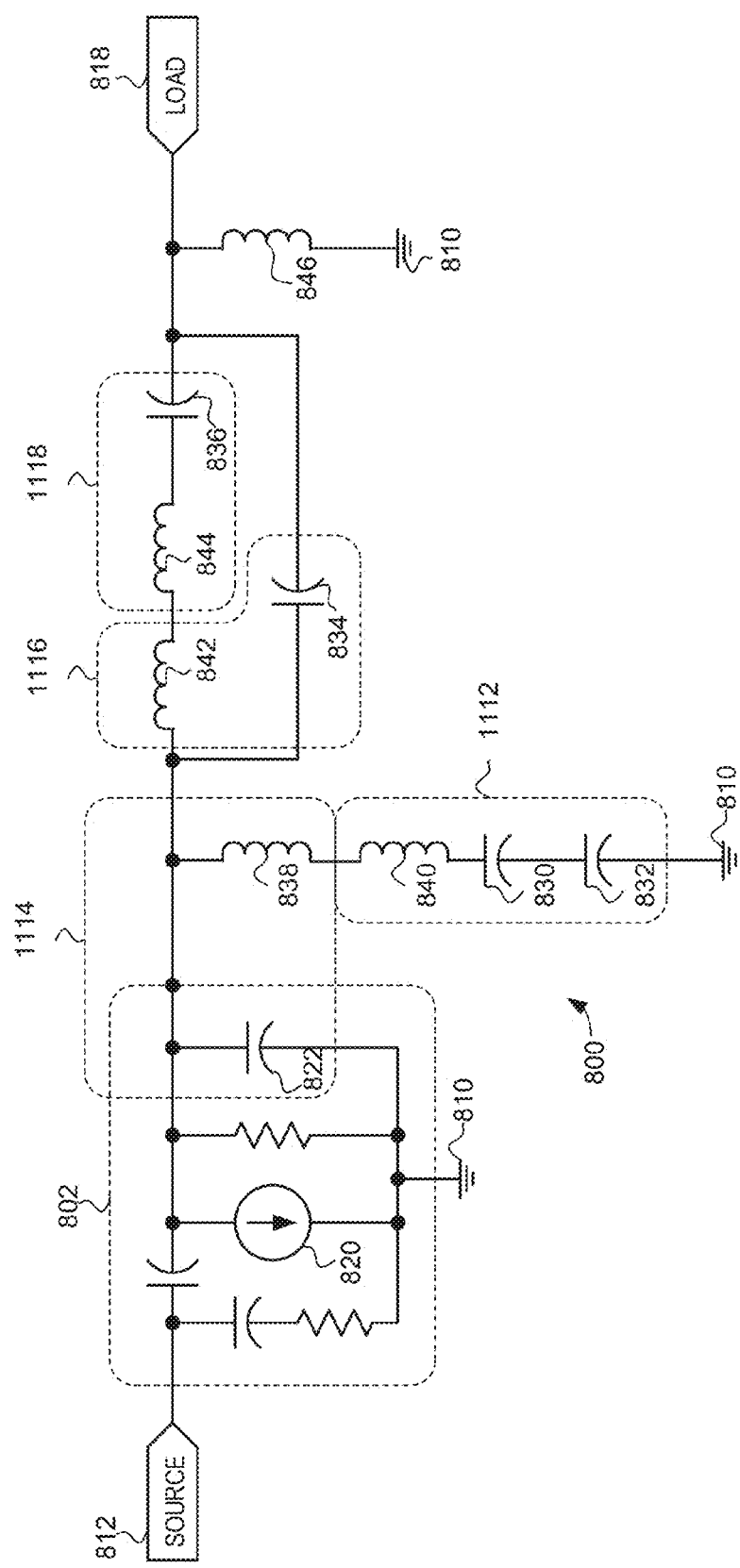

Turning now to FIG. 11, the exemplary class F amplifier 800 is again illustrated schematically. However, in this illustration each of the third set of resonant circuits are individually identified and labelled. In general, the third set of resonant circuits is configured to create an open circuit between the transistor 802 output and the load 818, and between the transistor 802 output and the ground 810, for signals at the third harmonic frequency ($3f_0$). Specifically, the third set of resonant circuits includes a first $3f_0$ resonant circuit 1112, a second $3f_0$ resonant circuit 1114, a third $3f_0$ resonant circuit 1116, and a fourth $3f_0$ resonant circuit 1118. The first $3f_0$ resonant circuit 1112 includes capacitances 830 and 832 and inductance 840 coupled in series between inductance 838 and ground 810. The second $3f_0$ resonant circuit 1114 includes intrinsic output capacitance 822 and inductance 838 coupled in parallel. The third $3f_0$ resonant circuit 1116 includes capacitance 834 and inductance 842 coupled in parallel. The fourth $3f_0$ resonant circuit 1118 includes capacitance 836 and inductance 844 coupled in series between inductance 842 and the output of the amplifier 800. Each of these resonant circuits 1112, 1114, 1116 and 1118 are configured to resonate at the third harmonic frequency ($3f_0$). As will be described in greater detail below, the resonant circuits 1112, 1114, 1116 and 1118 can be configured to resonate at the third harmonic frequency ($3f_0$) by selecting appropriate values for various capacitances and inductances in the output matching network 804.

Furthermore, it should be noted that in this embodiment the second $3f_0$ resonant circuit 1114 is dependent upon the resonating of the first $3f_0$ resonant circuit 1112 to be realized, and the third $3f_0$ resonant circuit 1116 is dependent upon the resonating of the fourth $3f_0$ resonant circuit 1118 to be realized.

Specifically, the first $3f_0$ resonant circuit 1112 is a series LC circuit configured to resonate at $3f_0$. Thus, for signals at $3f_0$, the first $3f_0$ resonant circuit 1112 resonates and provides low impedance connection between the inductance 838 and the ground 810.

With the first $3f_0$ resonant circuit 1112 resonating and providing such a low impedance connection, the second $3f_0$ resonant circuit 1114 is realized as a parallel LC circuit configured to resonate at $3f_0$. Specifically, with the first $3f_0$ resonant circuit 1112 resonating and providing a low impedance path to ground 810, the intrinsic output capacitance 822 and the inductance 838 are in a parallel configuration and thus form a parallel LC circuit configured to resonate at $3f_0$. Thus, for signals at $3f_0$, the second $3f_0$ resonant circuit 1114 provides high impedance (e.g., open circuit) between the transistor 802 output and ground 810.

It should again be noted that in addition to facilitating class F operation, the resonating of the second $3f_0$ resonant circuit 1114 also effectively reduces the potentially negative effects of the intrinsic output capacitance 822. Specifically, the resonating of the second $3f_0$ resonant circuit 1114 provides a high impedance that blocks the current path through the intrinsic output capacitance 822 for signals at $3f_0$. Without such blocking, the intrinsic output capacitance 822 would provide a path to the ground 810 that can interfere with efficient amplifier operation.

Likewise, the fourth $3f_0$ resonant circuit 1118 is a series LC circuit configured to resonate at $3f_0$. Thus, for signals at $3f_0$, the fourth $3f_0$ resonant circuit 1118 provides low impedance (e.g., short circuit). With the fourth $3f_0$ resonant circuit 1118 resonating and providing a low impedance path to the load 818, the third $3f_0$ resonant circuit 1116 is realized as a parallel LC circuit configured to resonate at $3f_0$. Specifically, with the fourth $3f_0$ resonant circuit 1118 resonating and providing a low impedance, the capacitance 834 and inductance 842 are then in parallel and form a parallel LC circuit configured to resonate at $3f_0$. Thus, at $3f_0$, the third $3f_0$ resonant circuit 1116 provides high impedance (e.g., open circuit) between the transistor 802 output and the load 818, thus blocking the current path to the load 818. Again, providing high impedance for signals at the third harmonic frequency $3f_0$ facilitates efficient class F amplifier operation.

Thus, the amplifier 800 illustrated in FIGS. 8-11 can facilitate class F operation. Specifically, with the first set of resonant circuits (912, 914, and 916) configured to present a selected output impedance to the transistor 802 output for signals at the fundamental frequency ($f_0$), the second set of resonant circuits (1012) configured to create a short circuit between the transistor 802 output and ground 810 for signals at the second harmonic frequency ($2f_0$), and the third set of resonant circuits (1112, 1114, 1116 and 1118) configured to create an open circuit between the transistor 802 output and the load 818, and between the transistor 802 output and the ground 810 for signals at the third harmonic frequency ($3f_0$), amplifier 800 can facilitate class F amplifier performance.

As with the previous embodiment, to facilitate the operation of the amplifier 800, the capacitances and inductances used to implement the output matching network 804 are selected to provide the desired operation of the various resonant circuits at their corresponding resonant frequencies. Thus, in the embodiment illustrated in FIGS. 8-11 the values of the capacitances 830, 832, 834 and 836 and inductances 838, 840, 842, 844 and 846 are selected to provide the resonant circuits 912, 914, 916, 1012, 1112, 1114, 1116 and 1118. As also indicated in FIGS. 9-11 the $f_0$ resonant circuits, the $2f_0$ resonant circuits, and the $3f_0$ resonant circuits "share" components in that some of the same components of the output matching network 804 are used in each of the $f_0$, $2f_0$, and $3f_0$ resonant circuits.

In one embodiment, the capacitances and inductances would have exact values or substantially equal values (e.g., values within +/−10 percent) of values that are selected based on the following relationships:

$$L_{11} = \frac{1}{5C_{int}(2\pi f_0)^2}$$

$$L_{22} = \frac{1}{8C_{22}(2\pi f_0)^2}$$

$$L_{33} = \frac{3}{8C_{int}(2\pi f_0)^2}$$

$$C_{11} = \frac{5}{4}C_{int}$$

where $L_{11}$ equals the sum of the inductance values of inductances 838 and 840, $L_{22}$ equals the sum of the inductance values of the inductances 842 and 844, $L_{33}$ equals the inductance value of the inductance 846, $C_{11}$ equals the series equivalent capacitance value of capacitances 830 and 832, $C_{22}$ equals the capacitance value of capacitance 834, $C_{33}$ equals the capacitance value of capacitance 836, and $C_{int}$ equals the capacitance value of the intrinsic output capacitance 822. By selecting values for the various capacitances and inductances using the relationships above, the output matching network 804 may provide the resonant circuits with resonant frequencies that may result in relatively efficient class F amplifier operation.

Like the embodiments of FIG. 3-6, the various capacitances and inductances in the embodiments of FIG. 8-11 can be provided by a variety of structures and devices. For example, the capacitances can be provided by combinations of discrete capacitors, integrated passive devices, and intrinsic capacitances of elements associated with the amplifier 800 (e.g., the capacitances of bonding pads). Likewise, the inductances can be provided by combinations of discrete inductors, integrated passive devices, and intrinsic inductances of elements associated with the amplifier 800 (e.g., the inductances of bonding wires).

Furthermore, it should again be noted that various capacitances and inductances can be implemented single devices or as multiple devices. For example, in a typical embodiment the capacitances 830 and 832 can be implemented as one (or more) physical capacitor, e.g., a single capacitor formed as an integrated passive device. Likewise, in a typical embodiment the inductances 838 and 840 can be implemented as one (or more) physical inductors, e.g., one or more inductors formed as portions of an integrated passive device. Likewise, the inductances 842 and 844 can be implemented as one (or more) physical inductors. In each case the number of devices used to provide the capacitances and inductances may vary according to the needs of a particular implementation.

Turning now to FIG. 12, a Smith chart 1200 and graph 1250 illustrate output impedances associated with an exemplary class F amplifier in accordance with the embodiments described herein (e.g., amplifier 800). Specifically, the Smith chart 1200 shows the impedance at the transistor 802 output for signals at the fundamental frequency ($f_0$), for signals at the second harmonic frequency ($2f_0$), and for signals at the third harmonic frequency ($3f_0$). As can be seen in the Smith chart 1200, for signals at $f_0$ the impedance seen at the transistor output is nearly equal to the load impedance, for signals at $2f_0$ the impedance seen at the transistor output is a near short circuit, and for signals at $3f_0$ the impedance seen at the transistor output is a near open circuit. Similar data is shown in graph 1250, which illustrates the impedance as function of frequency in graphical form. As can be seen in the graph 1250, for signals at $f_0$ the impedance is nearly equal to $R_{LOAD}$, for signals at $2f_0$ the impedance is nearly zero, and for signals at $3f_0$ the impedance seen at the transistor output is nearly an open circuit.

It should be noted that the embodiments described herein can be configured to provide an impedance transformation of the load impedance as it is "seen" at the transistor (e.g., transistor 302, transistor 802) output. For example, the embodiments described herein can be configured to provide a 1:1 impedance transformation ratio of the load impedance. Furthermore, the impedances and inductances can be modified to change the impedance transformation ratio to another ratio.

For example, in the embodiment of FIGS. 3-6 the capacitance 336 and inductance 346 can be selected to change the transformation ratio (e.g., to change the impedance transformation ratio to 2:1, 4:1, etc). In such an embodiment the capacitance 336 and inductance 346 additionally operate as an L-section matching network to provide a larger transformation ratio. Such a larger transformation ratio can be used to present significantly larger impedance to the transistor output, and this can facilitate easier impedance matching and power efficiency.

Such a modification of the impedance transformation ratio is facilitated by the fact that capacitance 336 and inductance 346 are isolated from the transistor 302 output by the resonating of the $2f_0$ and $3f_0$ resonant circuits. Specifically, the resonating of the $2f_0$ and $3f_0$ resonant circuits allows the modification of the capacitance 336 and inductance 346 to provide the desired impedance transformation at the fundamental frequency $f_0$ because such a modification affects only the impedance at the fundamental frequency $f_0$.

Figure 13:
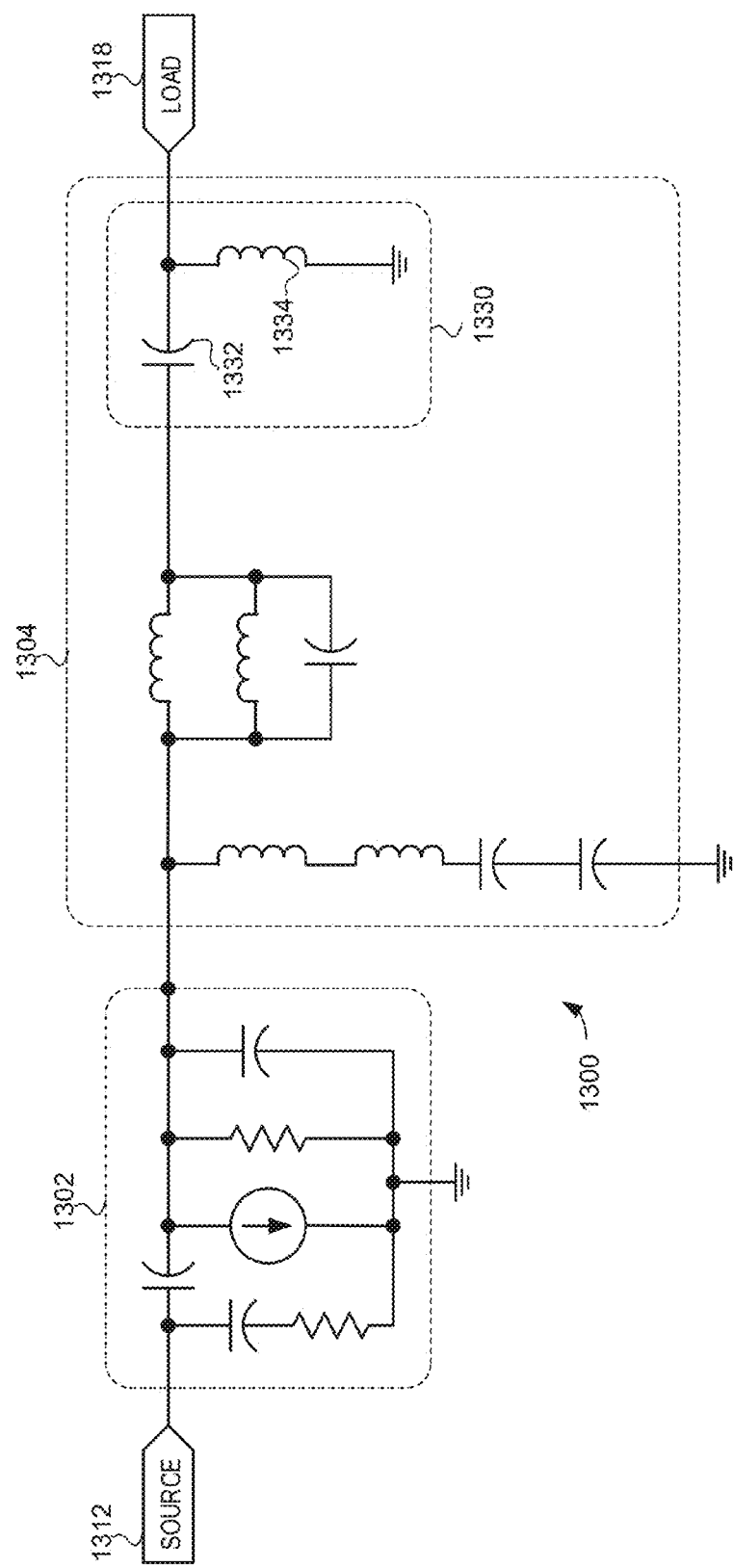
FIG. 13 is a schematic diagram of a class F amplifier that includes impedance transformation enhancement in accordance with another example embodiment.

Turning now to FIG. 13, another embodiment of an exemplary class F amplifier 1300 is illustrated schematically. In this embodiment the amplifier 1300 includes a transistor 1302 and an output matching network 1304. During operation, the amplifier 1300 receives an input signal at a source 1312, and outputs an amplified signal through the output matching network 1304 and to the load 1318. The signal has a fundamental frequency ($f_0$), and as such includes multiple harmonic signals, including a second harmonic ($2f_0$) and third harmonic ($3f_0$). As with the embodiments described above, the output matching network 1304 is configured to facilitate class F amplifier operation using a plurality of resonant circuits.

In FIG. 13, the amplifier 1300 is implemented to include an impedance transforming network 1330. In the illustrated example, the impedance transforming network 1330 is an the L-section matching network configured to provide an impedance transformation at the transistor 1302 output for signals at the fundamental frequency ($f_0$). This L-section matching network includes a capacitance 1332 and an inductance 1334. Specifically, the values for the capacitance 1332 and an inductance 1334 can be selected to provide a desired impedance transformation in addition to operating as part of the various resonant circuits. For example, by selecting appropriate values an impedance transformation of 2:1 or 4:1 (or some other ratio) can be provided.

It should be noted that in this implementation the impedance transforming network 1330 is implemented with the output matching network 1304. Specifically, the capacitance 1332 and the inductance 1334 are selected to provide capacitance and inductance for both the resonant circuits in the output matching network 1304 and the impedance transformation. For example, the capacitance 1332 can be implemented to provide capacitance 336 (of FIG. 3) and inductance 1334 can be implemented to provide inductance 346 (of FIG. 3) in addition to providing for the desired impedance transformation ratio. In such an embodiment, the capacitance 1332 could be implemented with a single capacitor or with multiple capacitors, and likewise the inductance 1334 could be implemented with a single inductor or with multiple inductors. In either case, the values for the various capacitances and inductances would be selected to provide both the resonant circuits in the output matching network 1304 and the impedance transformation provided by the impedance transforming network 1330.

Figure 14:
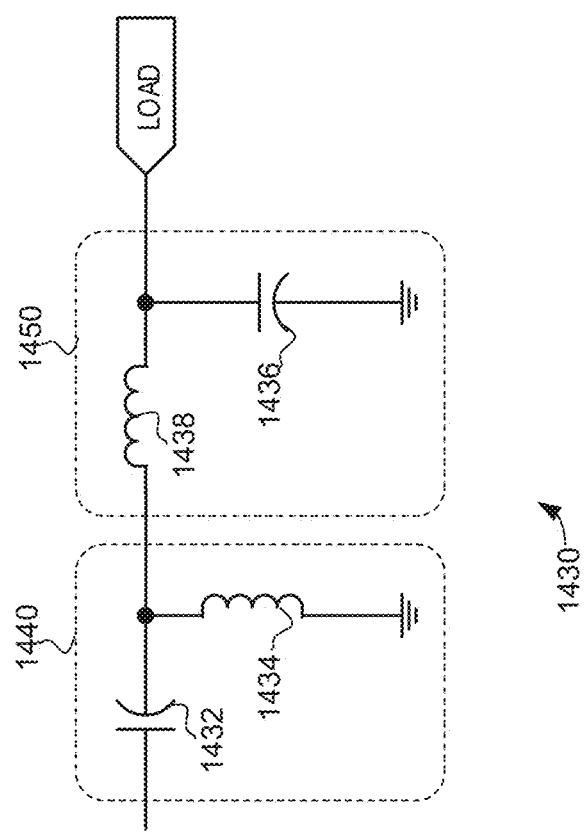
FIG. 14 is a schematic diagram of cascaded impedance transforming networks in accordance with another example embodiment.

In some embodiments multiple L-section networks can be used to provide greater impedance transformation. Turning now to FIG. 14, another embodiment of an impedance transforming network 1430 is illustrated. In the illustrated example, the impedance transforming network 1430 includes two cascading L-section matching networks 1440 and 1450 coupled in series between the transistor output and the load. Again, the L-section matching networks 1440 and 1450 are configured to provide an impedance transformation at the transistor output for signals at the fundamental frequency ($f_0$). The L-section matching network 1440 includes a capacitance 1432 and an inductance 1434. The L-section matching network 1450 includes a capacitance 1436 and an inductance 1438. The values for the capacitances 1432, 1436 and inductances 1434, 1438 would be selected to provide a desired impedance transformation. In general, the use of two cascading L-section matching networks 1440 and 1450 can facilitate increased impedance transformation over embodiments that use a single L-section matching network.

In the embodiment of FIG. 14, the second L-section matching network 1450 can be implemented with intrinsic components associated with a packaged amplifier. For example, the capacitance 1436 can be provided by a package capacitance. Specifically, the capacitance 1436 can comprise package lead capacitance. Likewise, the inductance 1438 can be implemented with bond wires used to couple the transistor output to the package.

Figure 15:
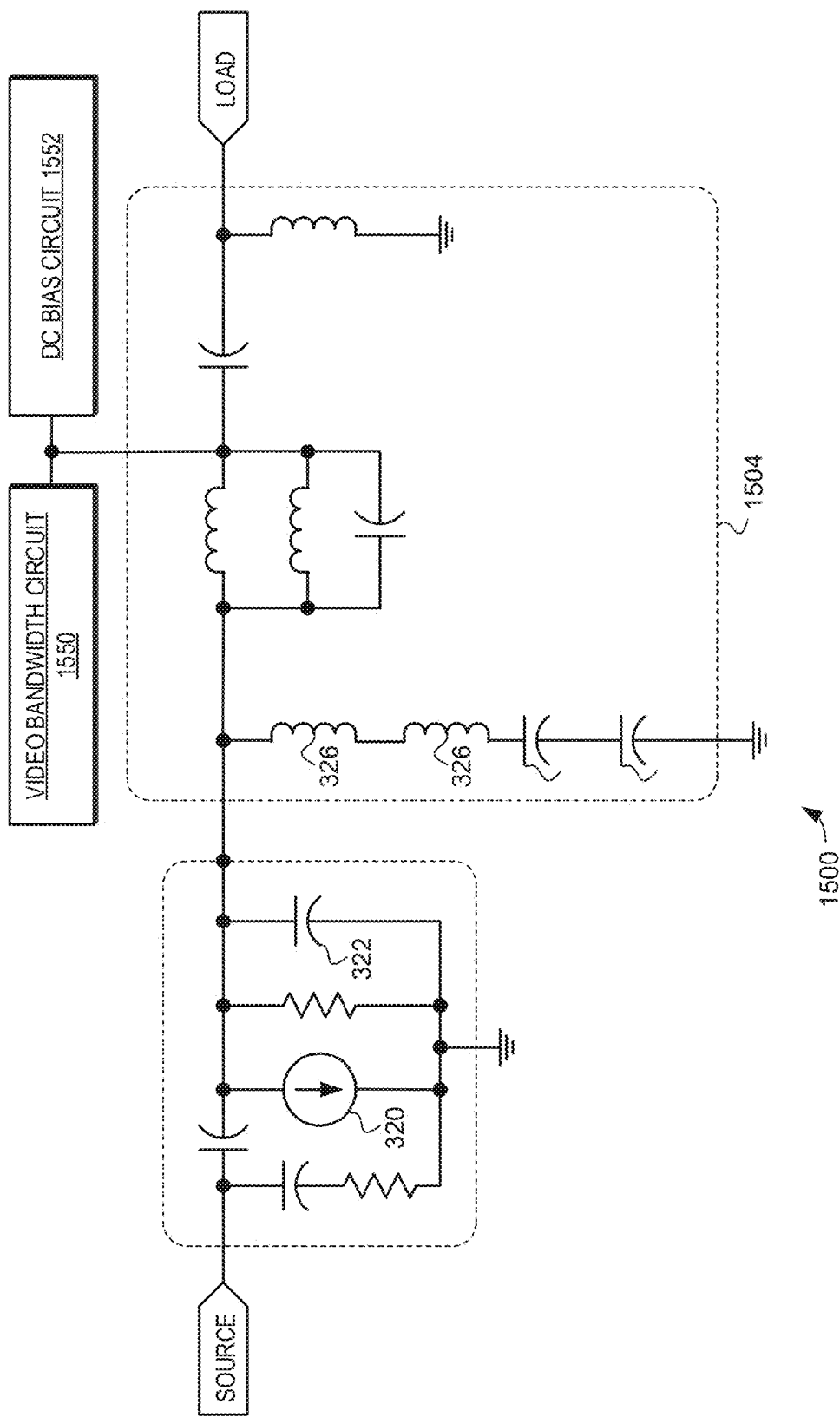
FIG. 15 is a schematic diagram of a class F amplifier that includes a video bandwidth circuit in accordance with another example embodiment.

In some embodiments it may be desirable to provide additional bandwidth to the RF amplifier. For example, video bandwidth circuits can be used to facilitate improved bandwidth in RF amplifiers, including the various amplifiers disclosed herein. Turning now to FIG. 15, an exemplary amplifier 1500 is implemented to include a video bandwidth circuit 1550 and a DC bias circuit 1552, both coupled to an output matching network 1504.

In general, the video bandwidth circuit 1550 (sometimes referred to as an "envelope frequency termination circuit") can be implemented to improve the low frequency response and thus the instantaneous signal bandwidth of the amplifier 1500. Essentially, the video bandwidth circuit 1550 is configured to have low impedance at envelope frequencies (i.e., frequencies greater than 0 Hz but less than $f_0$), so that the envelope current may readily pass through the video bandwidth circuit to ground, rather than being conveyed to the output.

In general, these video bandwidth circuits include envelope inductors, envelope resistors, and envelope capacitors coupled in series between a connection node (e.g., an RF cold point) and the ground reference node. These video bandwidth circuits may also include bypass capacitors coupled across one or more components of the video bandwidth circuit. So implemented, these video bandwidth circuits can improve the low frequency response and thus the instantaneous signal bandwidth of the amplifier 1500.

Figure 16:
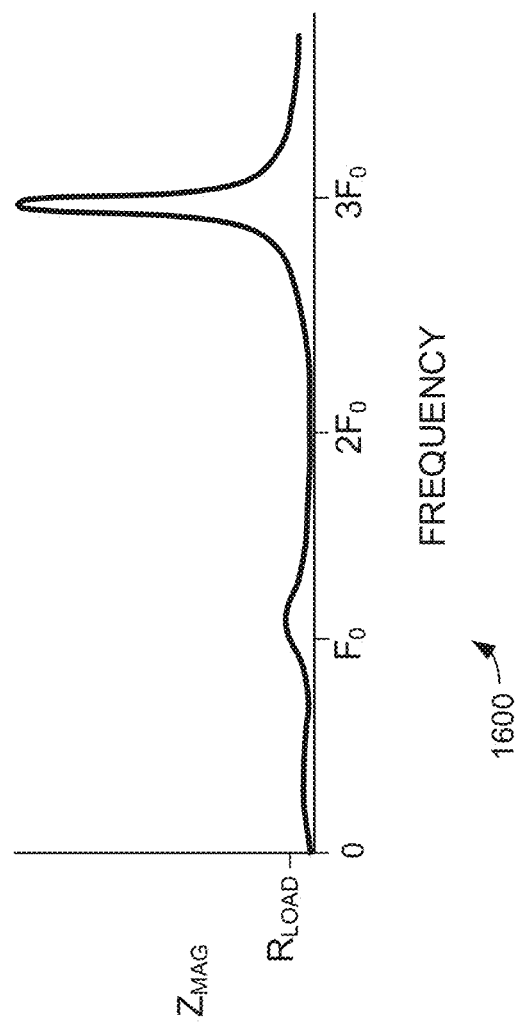
FIG. 16 is a graphical representation of output impedances of a class F amplifier that includes a video bandwidth circuit in accordance with another example embodiment.

Turning now to FIG. 16, graph 1600 illustrates exemplary output impedances associated with an exemplary class F amplifier (e.g., amplifier 1500) that includes a video bandwidth circuit (e.g., video bandwidth circuit 1550). As can be seen in graph 1600, the video bandwidth circuit reduces the output impedances at low frequencies (compared, for example, to the output impedances illustrated in graph 750 of FIG. 7). Furthermore, graph 1600 shows that for signals at $f_0$ the impedance remains nearly equal to $R_{LOAD}$, for signals at $2f_0$ the impedance remains nearly zero, and for signals at $3f_0$ the impedance seen at the transistor output remains nearly an open circuit. Thus, the amplifier embodiments described herein with a video bandwidth circuit can provide class F performance while also having improved low frequency response and bandwidth.

Figure 17:
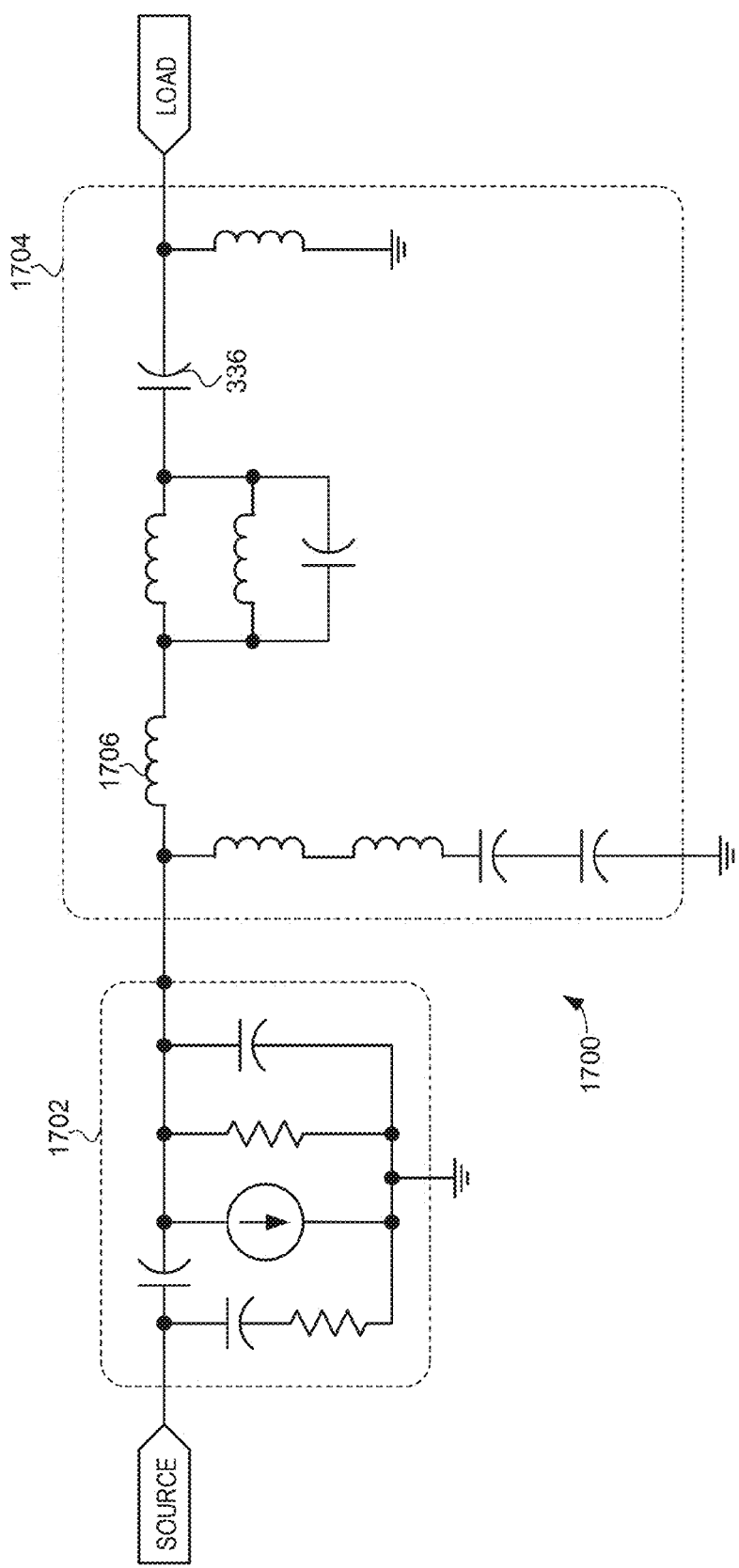
FIG. 17 is a schematic diagram of a class F amplifier in accordance with another example embodiment.

Turning now to FIG. 17, another exemplary class F amplifier 1700 embodiment is illustrated schematically. Again, this amplifier 1700 is similar to the amplifier 300 illustrated in FIGS. 3-6, with the addition of an inductance 1706. The amplifier 1700 thus includes a transistor 1702 and an output matching network 1704. In this embodiment, the output matching network 1704 further comprises bond wires coupled between the transistor 1702 output and the load. Specifically, the inductance 1706 represents the inductance of bond wires that can be used to facilitate the forming of the transistor 1702 and the output matching network 1704 on separate semiconductor dies that are then packaged together and connected with bond wires. In such an embodiment, the inductance 1706 of the bond wires can be incorporated into the output matching network in a way that facilitates class F amplifier operation. Specifically, the inductance 1706 of the bond wires adds a positive reactance, and that positive reactance can be compensated for by adding negative reactance. Such a negative reactance can be added to compensate by decreasing the capacitance value of capacitance 336, for example. It should also be noted that while the inductance 1706 is illustrated in a specific position in the output matching network 1704, that in other embodiments the bond wires and corresponding inductance 1706 could be in different positions, where those positions are determined by the configuration of the semiconductor dies and the locations of the bond wires between those semiconductor dies.

While the embodiments are described above with reference to various transistors and output matching networks, it should be noted that the various embodiments can be implemented as complete packaged devices. Typically, the transistor(s) (e.g., transistors 102, 302, 802) of the amplifier (e.g., amplifier 100, 300, 800) is formed on a semiconductor wafer, and that wafer is then singulated into individual dies. Each individual die can include one or more transistors and, in some cases, other elements of the amplifier, including various elements of the output matching network (e.g., output matching network 104, 304, 804). Such die(s) and other remaining elements of the output matching network are then incorporated into a device package. The package encases the die(s) and associated components, and the package includes leads that provide the electrical connection to the encased dies and associated components. A typical package also includes structural components (e.g., including a flange or substrate) to which the die(s) and other primary electrical components are coupled. Electrical connections between the die(s), the other components, and the package leads can be provided by bond wires or other suitable conductors. The package also may include an isolator that electrically isolates the package substrate or flange from the leads or alternatively may include encapsulation that provides such electrical isolation.

When completed, a packaged semiconductor device is a distinct device that may be mounted to a printed circuit board (PCB) or other suitable substrate, thus providing electrical connectivity to other components of an amplifier system. It should be noted that a typical package could include one or more amplifiers. Furthermore, such a package can include additional semiconductor devices and/or other components, including, for example, components of an input matching network coupled between the device's input lead and the input (e.g., the gate) of the transistor. Non-limiting examples of the type of packages that can be used include air cavity and over-molded packages. Furthermore, such packages can utilize a variety of different types of leads, such as gull wing leads, J-leads, pin grid arrays, ball grid arrays, land grid arrays, etc.

In a first embodiment a class F radio frequency (RF) amplifier configured to operate at a fundamental frequency ($f_O$) is provided. The RF amplifier comprising: a transistor including a transistor output and an intrinsic output capacitance; and an output matching network coupled to the transistor output, the output matching network including: a first set of resonant circuits configured to resonate at the fundamental frequency ($f_O$) and provide an output impedance to the transistor output for signals at the fundamental frequency ($f_O$), wherein the first set of resonant circuits includes a first $f_O$ resonant circuit configured to resonate at the fundamental frequency ($f_O$), and wherein when the first $f_O$ resonant circuit resonates, a second $f_O$ resonant circuit is realized in the output matching network, where the second $f_O$ resonant circuit includes the intrinsic output capacitance, and wherein the second $f_O$ resonant circuit is configured to resonate at the fundamental frequency ($f_O$) and create an open circuit between the transistor output and a ground, a second set of resonant circuits configured to resonate at a second harmonic frequency ($2f_O$) and create a short circuit between the transistor output and the ground for signals at the second harmonic frequency ($2f_O$), and a third set of resonant circuits configured to resonate at a third harmonic frequency ($3f_O$) and create an open circuit between the transistor output and the ground and create an open circuit between the transistor output and a load for signals at the third harmonic frequency ($3f_O$).

In a second embodiment a class F radio frequency (RF) amplifier configured to operate at a fundamental frequency ($f_O$) is provided. The RF amplifier comprising: a transistor including a transistor output and an intrinsic output capacitance; and an output matching network coupled to the transistor output, the output matching network including: a first set of resonant circuits configured to resonate at the fundamental frequency ($f_O$), wherein the first set of resonant circuits includes: a first $f_O$ resonant circuit configured to resonate at the fundamental frequency ($f_O$) and wherein when the first $f_O$ resonant circuit resonates, a second $f_O$ resonant circuit is realized in the output matching network, where the second $f_O$ resonant circuit includes the intrinsic output capacitance, and wherein the second $f_O$ resonant circuit is configured to resonate at the fundamental frequency ($f_O$) and create an open circuit between the transistor output and a ground for signals at the fundamental frequency ($f_O$), and a third $f_O$ resonant circuit configured to resonate at the fundamental frequency ($f_O$) and wherein when the third $f_O$ resonant circuit resonates, a fourth $f_O$ resonant circuit is realized in the output matching network, and wherein the fourth $f_O$ resonant circuit is configured to resonate at the fundamental frequency ($f_O$) and couple the transistor output to a load for signals at the fundamental frequency ($f_O$); a second set of resonant circuits configured to resonate at a second harmonic frequency ($2f_O$) and create a short circuit between the transistor output and the ground for signals at the second harmonic frequency ($2f_O$); and a third set of resonant circuits configured to resonate at a third harmonic frequency ($3f_O$), wherein the third set of resonant circuits includes: a first $3f_O$ resonant circuit configured to resonate at the third harmonic frequency ($3f_O$) and wherein when the first $3f_O$ resonant circuit resonates, a second $3f_O$ resonant circuit is realized in the output matching network, where the second $3f_O$ resonant circuit includes the intrinsic output capacitance, and wherein the second $3f_O$ resonant circuit is configured to resonate at the third harmonic frequency ($3f_O$) and create an open circuit between the transistor output and the ground for signals at the third harmonic frequency ($3f_O$), and a third $3f_O$ resonant circuit configured to resonate at the third harmonic frequency ($3f_O$) and wherein the third $3f_O$ resonant is configured to resonate at the third harmonic frequency ($3f_O$) and create an open circuit between the transistor output and the load for signals at the third harmonic frequency ($3f_O$).

In a third embodiment a semiconductor device is provided. The semiconductor device comprising: a device package including at least one output lead and at least one input lead, the device package encasing a class F radio frequency (RF) amplifier configured to operate at a fundamental frequency ($f_O$), the RF amplifier including: a transistor including a transistor output and an intrinsic output capacitance; and an output matching network coupled to the transistor output, the output matching network including: a first set of resonant circuits configured to resonate at the fundamental frequency ($f_0$) and provide an output impedance to the transistor output for signals at the fundamental frequency ($f_0$), wherein the first set of resonant circuits includes a first $f_0$ resonant circuit configured to resonate at the fundamental frequency ($f_0$), and wherein when the first $f_0$ resonant circuit resonates, a second $f_0$ resonant circuit is realized in the output matching network, where the second $f_0$ resonant circuit includes the intrinsic output capacitance, and wherein the second $f_0$ resonant circuit is configured to resonate at the fundamental frequency ($f_0$) and create an open circuit between the transistor output and a ground, a second set of resonant circuits configured to resonate at a second harmonic frequency ($2f_0$) and create a short circuit between the transistor output and the ground for signals at the second harmonic frequency ($2f_0$), and a third set of resonant circuits configured to resonate at a third harmonic frequency ($3f_0$) and create an open circuit between the transistor output and the ground and create an open circuit between the transistor output and a load for signals at the third harmonic frequency ($3f_0$).

The terms "first," "second," "third," "fourth" and the like in the description and the claims are used for distinguishing between elements and not necessarily for describing a particular structural, sequential or chronological order. It is to be understood that the terms so used are interchangeable under appropriate circumstances. Furthermore, the terms "comprise," "include," "have" and any variations thereof, are intended to cover non-exclusive inclusions, such that a circuit, process, method, article, or apparatus that comprises a list of elements is not necessarily limited to those elements, but may include other elements not expressly listed or inherent to such circuit, process, method, article, or apparatus. The term "coupled," as used herein, is defined as directly or indirectly connected in an electrical or non-electrical manner.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A class F radio frequency (RF) amplifier configured to operate at a fundamental frequency ($f_0$), the RF amplifier comprising:
    a transistor including a transistor output and an intrinsic output capacitance; and
    an output matching network coupled to the transistor output, the output matching network including:
        a first set of resonant circuits configured to resonate at the fundamental frequency ($f_0$) and provide an output impedance to the transistor output for signals at the fundamental frequency ($f_0$), wherein the first set of resonant circuits includes a first $f_0$ resonant circuit configured to resonate at the fundamental frequency ($f_0$), and wherein when the first $f_0$ resonant circuit resonates, a second $f_0$ resonant circuit is realized in the output matching network, where the second $f_0$ resonant circuit includes the intrinsic output capacitance, and wherein the second $f_0$ resonant circuit is configured to resonate at the fundamental frequency ($f_0$) and create an open circuit between the transistor output and a ground,
        a second set of resonant circuits configured to resonate at a second harmonic frequency ($2f_0$) and create a short circuit between the transistor output and the ground for signals at the second harmonic frequency ($2f_0$), and
        a third set of resonant circuits configured to resonate at a third harmonic frequency ($3f_0$) and create an open circuit between the transistor output and the ground and create an open circuit between the transistor output and a load for signals at the third harmonic frequency ($3f_0$).

2. The class F RF amplifier of claim 1 wherein the first set of resonant circuits further comprises:
    a third $f_0$ resonant circuit configured to resonate at the fundamental frequency ($f_0$), where the third $f_0$ resonant circuit is configured to resonate at the fundamental frequency ($f_0$) and couple the transistor output to the load for signals at the fundamental frequency ($f_0$).

3. The class F RF amplifier of claim 1 wherein the first set of resonant circuits further comprises:
    a third $f_0$ resonant circuit configured to resonate at the fundamental frequency ($f_0$) and wherein when the third $f_0$ resonant circuit resonates, a fourth $f_0$ resonant circuit is realized in the output matching network, and wherein the fourth $f_0$ resonant circuit is configured to resonate at the fundamental frequency ($f_0$) and couple the transistor output to the load for signals at the fundamental frequency ($f_0$).

4. The class F RF amplifier of claim 1 wherein the third set of resonant circuits comprises:
    a first $3f_0$ resonant circuit configured to resonate at the third harmonic frequency ($3f_0$) and wherein when the first $3f_0$ resonant circuit resonates, a second $3f_0$ resonant circuit is realized in the output matching network, where the second $3f_0$ resonant circuit includes the intrinsic output capacitance, and wherein the second $3f_0$ resonant circuit is configured to resonate at the third harmonic frequency ($3f_0$) and create an open circuit between the transistor output and the ground for signals at the third harmonic frequency ($3f_0$); and
    a third $3f_0$ resonant circuit configured to resonate at the third harmonic frequency ($3f_0$) and wherein when the third $3f_0$ resonant is configured to resonate at the third harmonic frequency ($3f_0$) and create an open circuit between the transistor output and the load for signals at the third harmonic frequency ($3f_0$).

5. The class F RF amplifier of claim 4 wherein the third set of resonant circuits further comprises:
    a fourth $3f_0$ resonant circuit configured to resonate at the third harmonic frequency ($3f_0$) and wherein when the fourth $3f_0$ resonant circuit resonates, the third $3f_0$ resonant circuit is realized in the output matching network.

6. The class F RF amplifier of claim 1 further comprising a video bandwidth circuit coupled to the output matching network.

7. The class F RF amplifier of claim 1 wherein the output matching network further comprises a first L-section matching network, the first L-section matching network configured to provide an extra impedance transformation at the transistor output for signals at the fundamental frequency ($f_0$).

8. The class F RF amplifier of claim 7 wherein the output matching network further comprises a second L-section matching network, the second L-section matching network configured to provide an extra impedance transformation at the transistor output for signals at the fundamental frequency ($f_0$).

9. The class F RF amplifier of claim 8 wherein the second L-section matching network comprises bondwire inductance and package capacitance.

10. The class F RF amplifier of claim 1 wherein the intrinsic output capacitance comprises a drain-source intrinsic capacitance.

11. A class F radio frequency (RF) amplifier configured to operate at a fundamental frequency ($f_0$), the RF amplifier comprising:
a transistor including a transistor output and an intrinsic output capacitance; and
an output matching network coupled to the transistor output, the output matching network including:
a first set of resonant circuits configured to resonate at the fundamental frequency ($f_0$), wherein the first set of resonant circuits includes:
a first $f_0$ resonant circuit configured to resonate at the fundamental frequency ($f_0$) and wherein when the first $f_0$ resonant circuit resonates, a second $f_0$ resonant circuit is realized in the output matching network, where the second $f_0$ resonant circuit includes the intrinsic output capacitance, and wherein the second $f_0$ resonant circuit is configured to resonate at the fundamental frequency ($f_0$) and create an open circuit between the transistor output and a ground for signals at the fundamental frequency ($f_0$), and
a third $f_0$ resonant circuit configured to resonate at the fundamental frequency ($f_0$) and wherein when the third $f_0$ resonant circuit resonates, a fourth $f_0$ resonant circuit is realized in the output matching network, and wherein the fourth $f_0$ resonant circuit is configured to resonate at the fundamental frequency ($f_0$) and couple the transistor output to a load for signals at the fundamental frequency ($f_0$);
a second set of resonant circuits configured to resonate at a second harmonic frequency ($2f_0$) and create a short circuit between the transistor output and the ground for signals at the second harmonic frequency ($2f_0$); and
a third set of resonant circuits configured to resonate at a third harmonic frequency ($3f_0$), wherein the third set of resonant circuits includes:
a first $3f_0$ resonant circuit configured to resonate at the third harmonic frequency ($3f_0$) and wherein when the first $3f_0$ resonant circuit resonates, a second $3f_0$ resonant circuit is realized in the output matching network, where the second $3f_0$ resonant circuit includes the intrinsic output capacitance, and wherein the second $3f_0$ resonant circuit is configured to resonate at the third harmonic frequency ($3f_0$) and create an open circuit between the transistor output and the ground for signals at the third harmonic frequency ($3f_0$), and
a third $3f_0$ resonant circuit configured to resonate at the third harmonic frequency ($3f_0$) and wherein the third $3f_0$ resonant is configured to resonate at the third harmonic frequency ($3f_0$) and create an open circuit between the transistor output and the load for signals at the third harmonic frequency ($3f_0$).

12. A semiconductor device, comprising:
a device package including at least one output lead and at least one input lead, the device package encasing a class F radio frequency (RF) amplifier configured to operate at a fundamental frequency ($f_0$), the RF amplifier including:
a transistor including a transistor output and an intrinsic output capacitance; and
an output matching network coupled to the transistor output, the output matching network including:
a first set of resonant circuits configured to resonate at the fundamental frequency ($f_0$) and provide an output impedance to the transistor output for signals at the fundamental frequency ($f_0$), wherein the first set of resonant circuits includes a first $f_0$ resonant circuit configured to resonate at the fundamental frequency ($f_0$), and wherein when the first $f_0$ resonant circuit resonates, a second $f_0$ resonant circuit is realized in the output matching network, where the second $f_0$ resonant circuit includes the intrinsic output capacitance, and wherein the second $f_0$ resonant circuit is configured to resonate at the fundamental frequency ($f_0$) and create an open circuit between the transistor output and a ground,
a second set of resonant circuits configured to resonate at a second harmonic frequency ($2f_0$) and create a short circuit between the transistor output and the ground for signals at the second harmonic frequency ($2f_0$), and
a third set of resonant circuits configured to resonate at a third harmonic frequency ($3f_0$) and create an open circuit between the transistor output and the ground and create an open circuit between the transistor output and a load for signals at the third harmonic frequency ($3f_0$).

13. The semiconductor device of claim 12 wherein the first set of resonant circuits further comprises:
a third $f_0$ resonant circuit configured to resonate at the fundamental frequency ($f_0$), where the third $f_0$ resonant circuit is configured to resonate at the fundamental frequency ($f_0$) and couple the transistor output to the load for signals at the fundamental frequency ($f_0$).

14. The semiconductor device of claim 12 wherein the first set of resonant circuits further comprises:
a third $f_0$ resonant circuit configured to resonate at the fundamental frequency ($f_0$) and wherein when the third $f_0$ resonant circuit resonates, a fourth $f_0$ resonant circuit is realized in the output matching network, and wherein the fourth $f_0$ resonant circuit is configured to resonate at the fundamental frequency ($f_0$) and couple the transistor output to the load for signals at the fundamental frequency ($f_0$).

15. The semiconductor device of claim 12 wherein the third set of resonant circuits comprises:
a first $3f_0$ resonant circuit configured to resonate at the third harmonic frequency ($3f_0$) and wherein when the first $3f_0$ resonant circuit resonates, a second $3f_0$ resonant circuit is realized in the output matching network, where the second $3f_0$ resonant circuit includes the intrinsic output capacitance, and wherein the second $3f_0$ resonant circuit is configured to resonate at the third harmonic frequency ($3f_0$) and create an open circuit between the transistor output and the ground for signals at the third harmonic frequency ($3f_0$); and a third $3f_0$ resonant circuit configured to resonate at the third harmonic frequency ($3f_0$) and wherein the third $3f_0$ resonant is configured to resonate at the third harmonic frequency ($3f_0$) and create an open circuit between the transistor output and the load for signals at the third harmonic frequency ($3f_0$).

16. The semiconductor device of claim 15 wherein the third set of resonant circuits further comprises:

a fourth $3f_0$ resonant circuit configured to resonate at the third harmonic frequency ($3f_0$) and wherein when the fourth $3f_0$ resonant circuit resonates, the third $3f_0$ resonant circuit is realized in the output matching network.

17. The semiconductor device of claim 12 further comprising a video bandwidth circuit coupled to the output matching network.

18. The semiconductor device of claim 12 wherein the output matching network further comprises a first L-section matching network, the first L-section matching network configured to provide an extra impedance transformation at the transistor output for signals at the fundamental frequency ($f_0$).

19. The semiconductor device of claim 18 wherein the output matching network further comprises a second L-section matching network, the second L-section matching network configured to provide an extra impedance transformation at the transistor output for signals at the fundamental frequency ($f_0$).

20. The semiconductor device of claim 19 wherein the second L-section matching network comprises bond wire inductance and package capacitance.

21. The semiconductor device of claim 12 wherein the output matching network further comprises bond wires coupled between the transistor output and the load.

* * * * *

UNITED STATES PATENT AND TRADEMARK OFFICE
CERTIFICATE OF CORRECTION

PATENT NO. : 9,673,766 B1  
APPLICATION NO. : 15/158405  
DATED : June 6, 2017  
INVENTOR(S) : Jeffrey S. Roberts et al.

It is certified that error appears in the above-identified patent and that said Letters Patent is hereby corrected as shown below:

In the Specification

At Column 9, Line 19, after the equation for $C_1$, please insert the following equation:
--$C_3 = 8C_2$--

At Column 13, Line 55, after the equation for $C_{11}$, please insert the following equation:
--$C_{33} = 8C_{22}$--

Signed and Sealed this
Twenty-sixth Day of June, 2018

Andrei Iancu
*Director of the United States Patent and Trademark Office*